(12) United States Patent
Borodovsky

(10) Patent No.: US 10,236,161 B2
(45) Date of Patent: Mar. 19, 2019

(54) FINE ALIGNMENT SYSTEM FOR ELECTRON BEAM EXPOSURE SYSTEM

(71) Applicant: Intel Corporation, Santa Clara, CA (US)

(72) Inventor: Yan A. Borodovsky, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/555,447

(22) PCT Filed: Sep. 18, 2015

(86) PCT No.: PCT/US2015/051031
§ 371 (c)(1),
(2) Date: Sep. 1, 2017

(87) PCT Pub. No.: WO2016/171754
PCT Pub. Date: Oct. 27, 2016

(65) Prior Publication Data
US 2018/0033593 A1 Feb. 1, 2018

Related U.S. Application Data

(60) Provisional application No. 62/150,728, filed on Apr. 21, 2015.

(51) Int. Cl.
*G06K 9/00* (2006.01)
*H01J 37/304* (2006.01)
(Continued)

(52) U.S. Cl.
CPC ........ *H01J 37/3045* (2013.01); *H01J 37/045* (2013.01); *H01J 37/09* (2013.01);
(Continued)

(58) Field of Classification Search
CPC ...... H01J 37/3045; H01J 37/045; H01J 37/09; H01J 37/3174; H01J 37/3177; H01J 37/20;
(Continued)

(56) References Cited

U.S. PATENT DOCUMENTS 5,313,068 A * 5/1994 Meiri .................... B82Y 10/00
250/398
5,570,405 A 10/1996 Chan et al.
(Continued)

FOREIGN PATENT DOCUMENTS

EP 1033741 9/2000
GB 1 579 280 11/1980
(Continued)

OTHER PUBLICATIONS

International Search Report for PCT Patent Application No. PCT/US2015/051031 dated Jul. 15, 2016, 3 pgs.
(Continued)

*Primary Examiner* — Jose L Couso
(74) *Attorney, Agent, or Firm* — Schwabe, Williamson & Wyatt, P.C.

(57) ABSTRACT

Lithographic apparatuses suitable for, and methodologies involving, complementary e-beam lithography (CEBL) are described. In an example, a method of fine alignment of an e-beam tool includes projecting an electron image of a plurality of apertures of an e-beam column over an X-direction alignment feature of a wafer while moving the wafer along the Y-direction. The method also includes detecting a time-resolved back-scattered electron (BSE) detection response waveform during the projecting. The method also includes determining an X-position of every edge of every feature of the X-direction alignment feature by calculating a derivative of the BSE detection response waveform. The
(Continued)

method also includes, subsequent to determining an X-position of every edge of every feature of the X-direction alignment feature, adjusting an alignment of the e-beam column to the wafer.

16 Claims, 17 Drawing Sheets

(51) Int. Cl.
| | |
|---|---|
| H01L 21/027 | (2006.01) |
| H01L 21/033 | (2006.01) |
| H01J 37/317 | (2006.01) |
| H01L 21/311 | (2006.01) |
| H01L 23/544 | (2006.01) |
| H01J 37/04 | (2006.01) |
| H01J 37/09 | (2006.01) |
| H01J 37/20 | (2006.01) |
| H01J 37/244 | (2006.01) |

(52) U.S. Cl.
CPC ...... *H01J 37/3174* (2013.01); *H01J 37/3177* (2013.01); *H01L 21/0277* (2013.01); *H01L 21/0337* (2013.01); *H01L 21/31144* (2013.01); *H01L 23/544* (2013.01); *H01J 37/20* (2013.01); *H01J 37/244* (2013.01); *H01J 2237/0453* (2013.01); *H01J 2237/24475* (2013.01); *H01J 2237/24578* (2013.01); *H01J 2237/2817* (2013.01); *H01L 2223/5442* (2013.01); *H01L 2223/54426* (2013.01); *H01L 2223/54453* (2013.01); *H01L 2223/54473* (2013.01)

(58) Field of Classification Search
CPC .... H01J 37/244; H01J 37/147; H01J 37/3007; H01J 37/3026; H01J 2237/0453; H01J 2237/24475; H01J 2237/24578; H01J 2237/2817; H01J 2237/004; H01J 2237/28; H01J 2237/0437; H01J 2237/31762; H01J 2237/31764; H01J 2237/31774; H01L 21/0277; H01L 21/31111; H01L 21/31144; H01L 21/32133; H01L 21/32139; H01L 2223/5442; H01L 2223/54426; H01L 2223/54453; H01L 2223/54473; H01L 2924/00; H01L 2924/0002; H01L 2924/54426; H01L 2924/54453; H01L 23/544; G03F 1/72; G03F 1/86; G03F 9/7049; B82Y 10/00; B82Y 40/00; Y10S 430/143; Y10S 438/975; G06T 2207/10061; G06T 2207/20016; G06T 2207/30148; G06T 7/0004; G06T 7/001; H04N 7/18; H04N 7/183
See application file for complete search history.

(56) References Cited

U.S. PATENT DOCUMENTS

| | | | |
|---|---|---|---|
| 6,261,726 B1 | 7/2001 | Brooks et al. | |
| 6,262,425 B1* | 7/2001 | Gordon | B82Y 10/00 250/397 |
| 2002/0004283 A1 | 1/2002 | Boulin et al. | |
| 2002/0054284 A1* | 5/2002 | de Jager | B82Y 10/00 355/67 |
| 2002/0074506 A1* | 6/2002 | Gordon | B82Y 10/00 250/398 |
| 2007/0085027 A1* | 4/2007 | Baxter | B82Y 10/00 250/491.1 |
| 2009/0176167 A1 | 7/2009 | Hulsebos | |
| 2009/0206280 A1* | 8/2009 | Koshiba | B82Y 10/00 250/492.2 |
| 2012/0164583 A1 | 6/2012 | Yamaguchi | |
| 2014/0231668 A1 | 8/2014 | Yasuda | |
| 2014/0254913 A1* | 9/2014 | Pang | G03F 1/70 382/144 |
| 2015/0144788 A1* | 5/2015 | Chen | H01J 37/261 250/307 |
| 2017/0357153 A1* | 12/2017 | Platzgummer | H01J 37/3177 |

FOREIGN PATENT DOCUMENTS

| | | |
|---|---|---|
| JP | H07 192994 A | 7/1995 |
| JP | 2000252198 | 9/2000 |

OTHER PUBLICATIONS

International Written Opinion for PCT Patent Application No. PCT/US2015/051031 dated Jul. 15, 2016, 7 pgs.
International Preliminary Search Report for PCT/US2015/051031, dated Oct. 24, 2017, 8 pages.
Partial Search Report for European Patent Application No. 15890148.8 dated Nov. 27, 2018, 12 pgs.

* cited by examiner

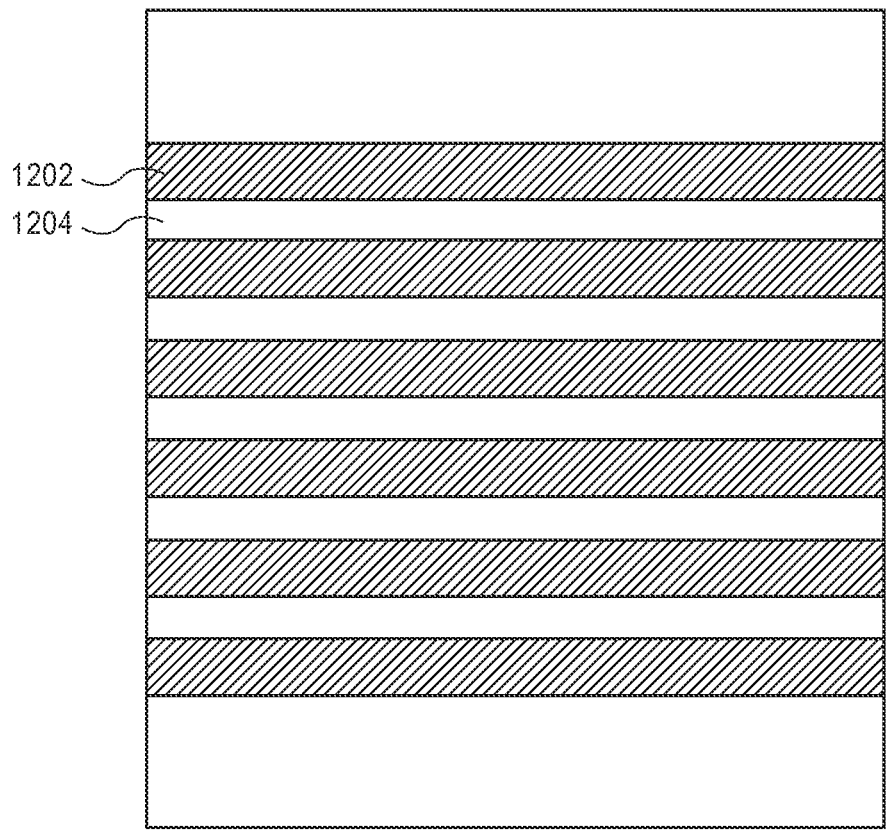
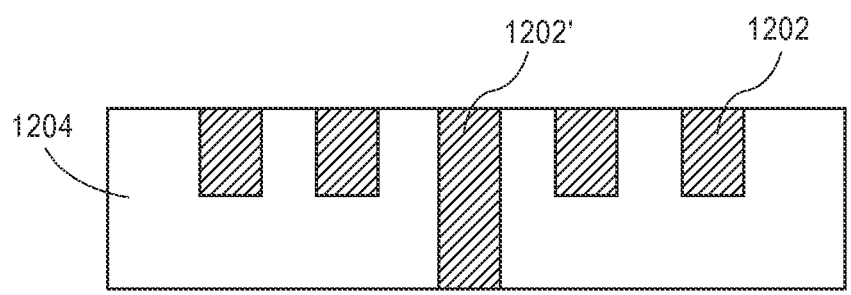
FIG. 12

FINE ALIGNMENT SYSTEM FOR ELECTRON BEAM EXPOSURE SYSTEM

CROSS-REFERENCE TO RELATED APPLICATIONS

This patent application is a U.S. National Phase Application under 35 U.S.C. § 371 of International Application No. PCT/US2015/051031, filed Sep. 18, 2015, entitled "FINE ALIGNMENT SYSTEM FOR ELECTRON BEAM EXPOSURE SYSTEM," which claims the benefit of U.S. Provisional Application No. 62/150,728, filed on Apr. 21, 2015, the entire contents of which are hereby incorporated by reference herein.

TECHNICAL FIELD

Embodiments of the invention are in the field of lithography and, in particular, lithography involving complementary e-beam lithography (CEBL).

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

Integrated circuits commonly include electrically conductive microelectronic structures, which are known in the art as vias. Vias can be used to electrically connect metal lines above the vias to metal lines below the vias. Vias are typically formed by a lithographic process. Representatively, a photoresist layer may be spin coated above a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias. When patterning extremely small vias with extremely small pitches by such lithographic processes, several challenges present themselves.

One such challenge is that the overlay between the vias and the overlying metal lines, and the overlay between the vias and the underlying metal lines, generally needs to be controlled to high tolerances on the order of a quarter of the via pitch. As via pitches scale ever smaller over time, the overlay tolerances tend to scale with them at an even greater rate than lithographic equipment is able to scale with.

Another such challenge is that the critical dimensions of the via openings generally tend to scale faster than the resolution capabilities of lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing. A further such challenge is that the extremely small via pitches generally tend to be below the resolution capabilities of even extreme ultraviolet (EUV) lithographic scanners. As a result, commonly two, three, or more different lithographic masks may have to be used, which tends to increase the fabrication costs. At some point, if pitches continue to decrease, it may not be possible, even with multiple masks, to print via openings for these extremely small pitches using conventional scanners.

In the same vein, the fabrication of cuts (i.e., disruptions or breaking of continuity) in the metal line structures associated with metal vias is faced with similar scaling issues.

Thus, improvements are needed in the area of lithographic processing technologies and capabilities.

BRIEF DESCRIPTION OF THE DRAWINGS

FIG. 12 illustrates a plan view and corresponding cross-sectional view of a previous layer metallization structure, in accordance with an embodiment of the present invention.

DESCRIPTION OF THE EMBODIMENTS

Lithographic apparatuses suitable for, and methodologies involving, complementary e-beam lithography (CEBL) are described. In the following description, numerous specific details are set forth, such as specific tooling, integration and material regimes, in order to provide a thorough understanding of embodiments of the present invention. It will be apparent to one skilled in the art that embodiments of the present invention may be practiced without these specific details. In other instances, well-known features, such as single or dual damascene processing, are not described in detail in order to not unnecessarily obscure embodiments of the present invention. Furthermore, it is to be understood that the various embodiments shown in the Figures are illustrative representations and are not necessarily drawn to scale. In some cases, various operations will be described as multiple discrete operations, in turn, in a manner that is most helpful in understanding the present invention, however, the order of description should not be construed to imply that these operations are necessarily order dependent. In particular, these operations need not be performed in the order of presentation.

One or more embodiments described herein are directed to lithographic approaches and tooling involving or suitable for complementary e-beam lithography (CEBL), including semiconductor processing considerations when implementing such approaches and tooling. Particular embodiments are directed to fine alignment systems for electron beam exposure systems.

Complementary lithography draws on the strengths of two lithography technologies, working hand-in-hand, to lower the cost of patterning critical layers in logic devices at 20 nm half-pitch and below, in high-volume manufacturing (HVM). The most cost-effective way to implement complementary lithography is to combine optical lithography with e-beam lithography (EBL). The process of transferring integrated circuit (IC) designs to the wafer entails the following: optical lithography to print unidirectional lines (either strictly unidirectional or predominantly unidirectional) in a pre-defined pitch, pitch division techniques to increase line density, and EBL to "cut" the lines. EBL is also used to pattern other critical layers, notably contact and via holes. Optical lithography can be used alone to pattern other layers. When used to complement optical lithography, EBL is referred to as CEBL, or complementary EBL. CEBL is directed to breaking continuity in lines. By not attempting to pattern all layers, CEBL plays a complementary but crucial role in meeting the industry's patterning needs at advanced (smaller) technology nodes (e.g., 10 nm or smaller such as 7 nm or 5 nm technology nodes). CEBL also extends the use of current optical lithography technology, tools and infrastructure.

Figure 1A:
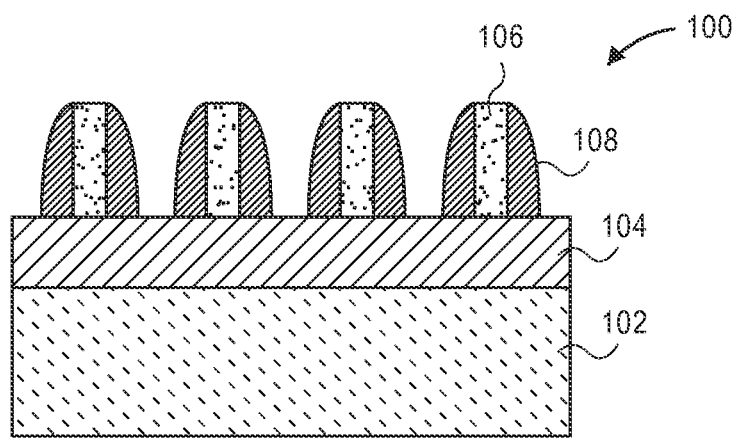
FIG. 1A illustrates a cross-sectional view of a starting structure following deposition, but prior to patterning, of a hardmask material layer formed on an interlayer dielectric (ILD) layer.
Figure 1B:
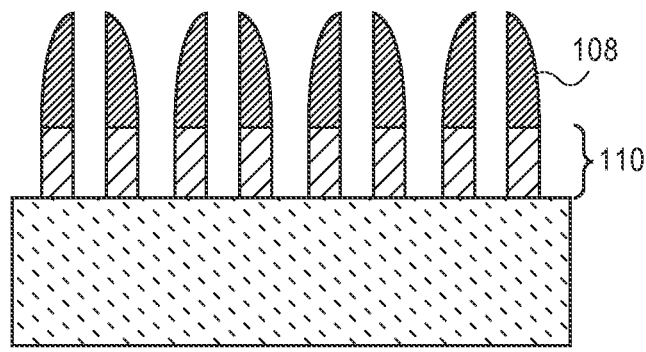
FIG. 1B illustrates a cross-sectional view of the structure of FIG. 1A following patterning of the hardmask layer by pitch halving.

As mentioned above, pitch division techniques can be used to increase a line density prior to using EBL to cut such lines. In a first example, pitch halving can be implemented to double the line density of a fabricated grating structure. FIG. 1A illustrates a cross-sectional view of a starting structure following deposition, but prior to patterning, of a hardmask material layer formed on an interlayer dielectric (ILD) layer. FIG. 1B illustrates a cross-sectional view of the structure of FIG. 1A following patterning of the hardmask layer by pitch halving.

Referring to FIG. 1A, a starting structure 100 has a hardmask material layer 104 formed on an interlayer dielectric (ILD) layer 102. A patterned mask 106 is disposed above the hardmask material layer 104. The patterned mask 106 has spacers 108 formed along sidewalls of features (lines) thereof, on the hardmask material layer 104.

Referring to FIG. 1B, the hardmask material layer 104 is patterned in a pitch halving approach. Specifically, the patterned mask 106 is first removed. The resulting pattern of the spacers 108 has double the density, or half the pitch or the features of the mask 106. The pattern of the spacers 108 is transferred, e.g., by an etch process, to the hardmask material layer 104 to form a patterned hardmask 110, as is depicted in FIG. 1B. In one such embodiment, the patterned hardmask 110 is formed with a grating pattern having unidirectional lines. The grating pattern of the patterned hardmask 110 may be a tight pitch grating structure. For example, the tight pitch may not be achievable directly through conventional lithography techniques. Even further, although not shown, the original pitch may be quartered by a second round of spacer mask patterning. Accordingly, the grating-like pattern of the patterned hardmask 110 of FIG. 1B may have hardmask lines spaced at a constant pitch and having a constant width relative to one another. The dimensions achieved may be far smaller than the critical dimension of the lithographic technique employed.

Accordingly, as a first portion of a CEBL integration scheme, a blanket film may be patterned using lithography and etch processing which may involve, e.g., spacer-based-double-patterning (SBDP) or pitch halving, or spacer-based-quadruple-patterning (SBQP) or pitch quartering. It is to be appreciated that other pitch division approaches may also be implemented.

Figure 2:
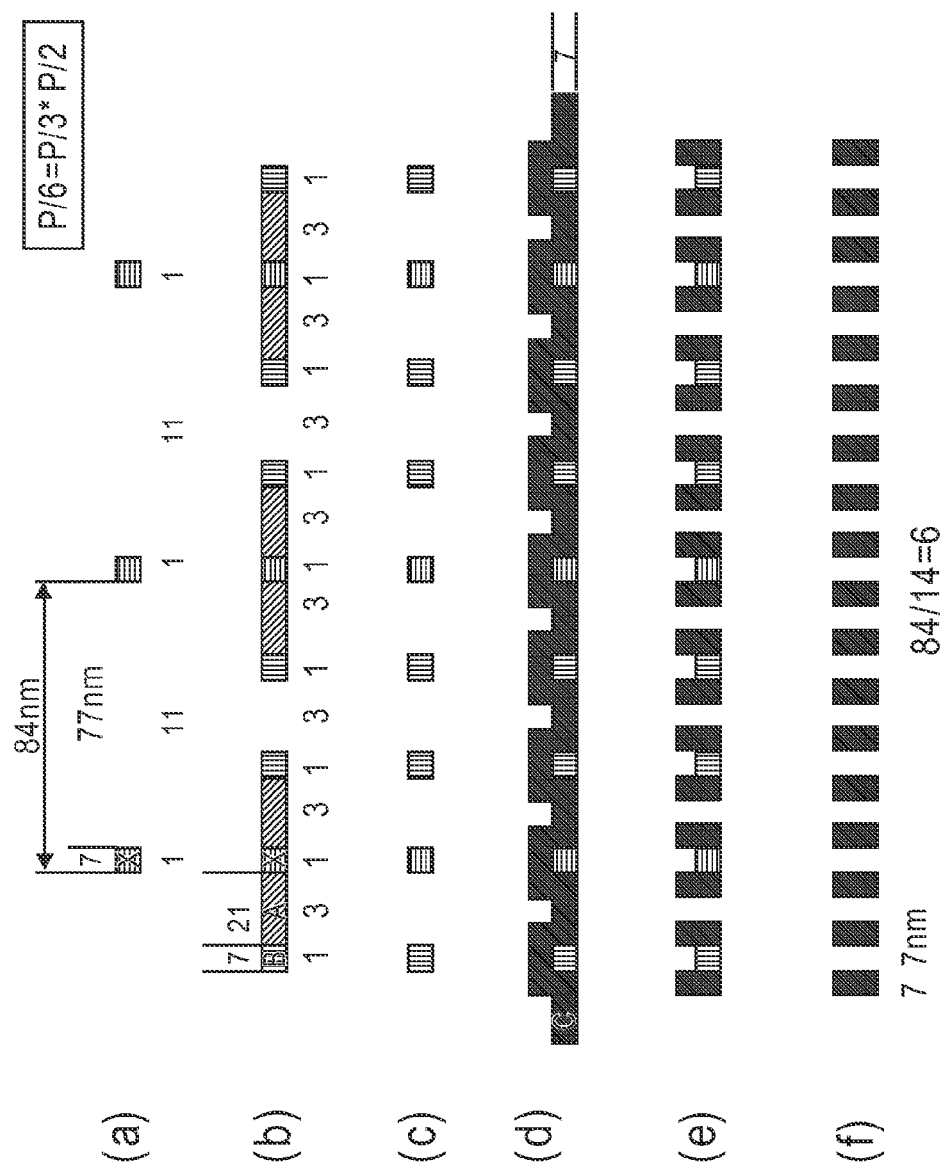
FIG. 2 illustrates cross-sectional views in a spacer-based-sextuple-patterning (SBSP) processing scheme which involves pitch division by a factor of six.

For example, FIG. 2 illustrates cross-sectional views in a spacer-based-sextuple-patterning (SBSP) processing scheme which involves pitch division by a factor of six. Referring to FIG. 2, at operation (a), a sacrificial pattern X is shown following litho, slim and etch processing. At operation (b), spacers A and B are shown following deposition and etching. At operation (c), the pattern of operation (b) is shown following spacer A removal. At operation (d), the pattern of operation (c) is shown following spacer C deposition. At operation (e), the pattern of operation (d) is shown following spacer C etch. At operation (f), a pitch/6 pattern is achieved following sacrificial pattern X removal and spacer B removal.

Figure 3:
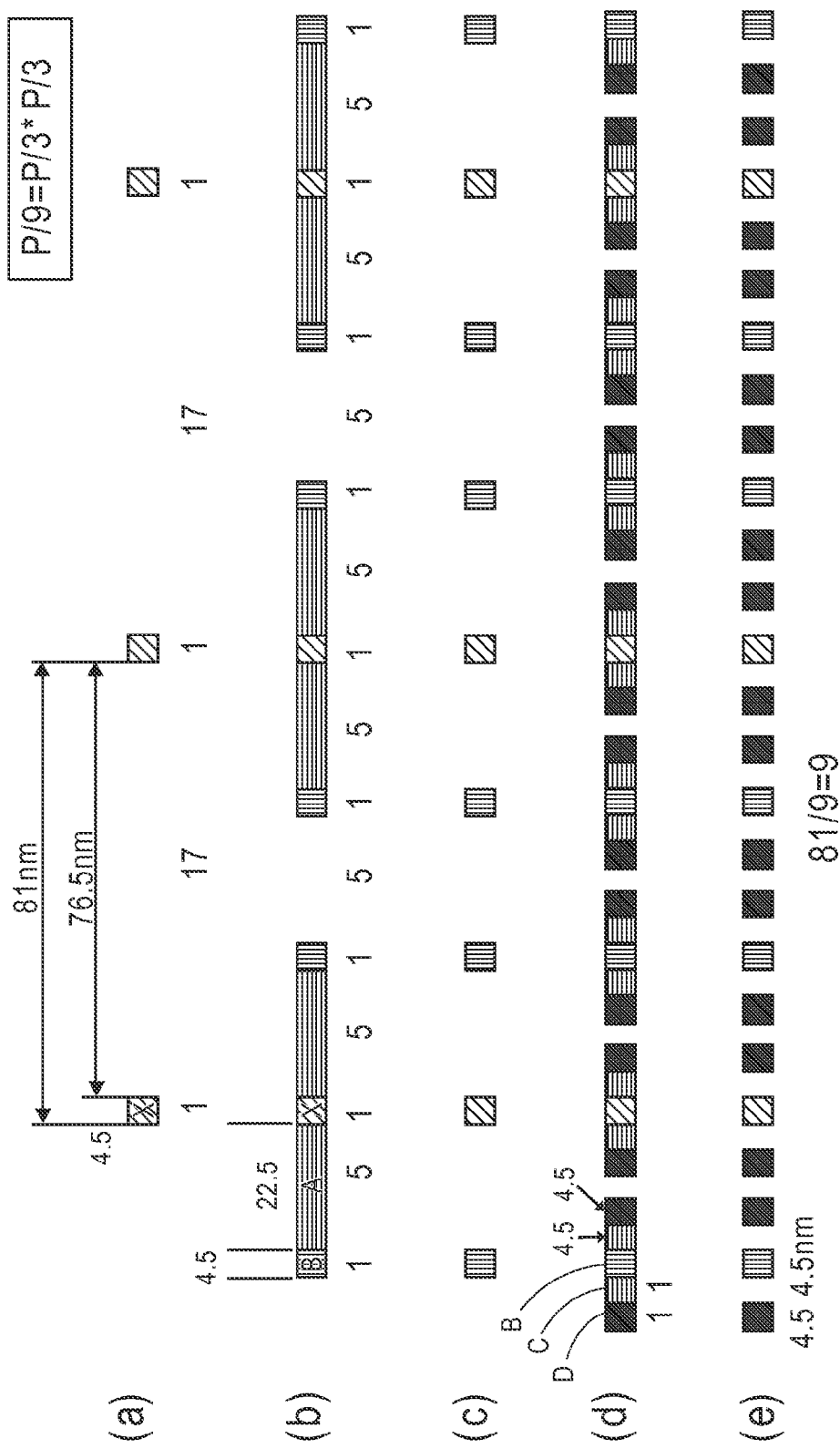
FIG. 3 illustrates cross-sectional views in a spacer-based-nonuple-patterning (SBNP) processing scheme which involves pitch division by a factor of nine.

In another example, FIG. 3 illustrates cross-sectional views in a spacer-based-nonuple-patterning (SBNP) processing scheme which involves pitch division by a factor of nine. Referring to FIG. 3, at operation (a), a sacrificial pattern X is shown following litho, slim and etch processing. At operation (b), spacers A and B are shown following deposition and etching. At operation (c), the pattern of operation (b) is shown following spacer A removal. At operation (d), the pattern of operation (c) is shown following spacer C and D deposition and etch. At operation (e), a pitch/9 pattern is achieved following spacer C removal.

In any case, in an embodiment, complementary lithography as described herein involves first fabricating a gridded layout by conventional or state-of the-art lithography, such as 193 nm immersion lithography (193i). Pitch division may be implemented to increase the density of lines in the gridded layout by a factor of n. Gridded layout formation with 193i lithography plus pitch division by a factor of n can be designated as 193i+P/n Pitch Division. Patterning of the pitch divided gridded layout may then be patterned using electron beam direct write (EBDW) "cuts," as is described in greater detail below. In one such embodiment, 193 nm immersion scaling can be extended for many generations with cost effective pitch division. Complementary EBL is used to break gratings continuity and to pattern vias. It is to be appreciated that other layouts, including layouts that are not gridded, may also be used.

More specifically, embodiments described herein are directed to patterning features during the fabrication of an integrated circuit. In one embodiment, CEBL is used to pattern openings for forming vias. Vias are metal structures used to electrically connect metal lines above the vias to metal lines below the vias. In another embodiment, CEBL is used to form non-conductive spaces or interruptions along the metal lines (i.e., breaking continuity of the metal lines). Conventionally, such interruptions have been referred to as "cuts" since the process involved removal or cutting away of portions of the metal lines. However, in a damascene approach, the interruptions may be referred to as "plugs" which are regions along a metal line trajectory that are actually not metal at any stage of the fabrication scheme, but are rather preserved regions where metal cannot be formed. In either case, however, use of the terms cuts or plugs may be done so interchangeably to refer to breaking continuity of the ultimately formed metal lines. Via opening and metal line cut or plug formation is commonly referred to as back end of line (BEOL) processing for an integrated circuit. In another embodiment, CEBL is used for front end of line (FEOL) processing. For example, the scaling of active region dimensions (such as fin dimensions) and/or associated gate structures can be performed using CEBL techniques as described herein.

As described above, electron beam (ebeam) lithography may be implemented to complement standard lithographic techniques in order to achieved desired scaling of features for integrated circuit fabrication. An electron beam lithography tool may be used to perform the ebeam lithography. In an exemplary embodiment, FIG. 4A is a cross-sectional schematic representation of an ebeam column of an electron beam lithography apparatus, in accordance with an embodiment of the present invention, with FIG. 4B illustrating a magnified portion of FIG. 4A and FIG. 4C illustrating a backscattered electron (BSE) pathway through FIG. 4B.

Figure 4A:
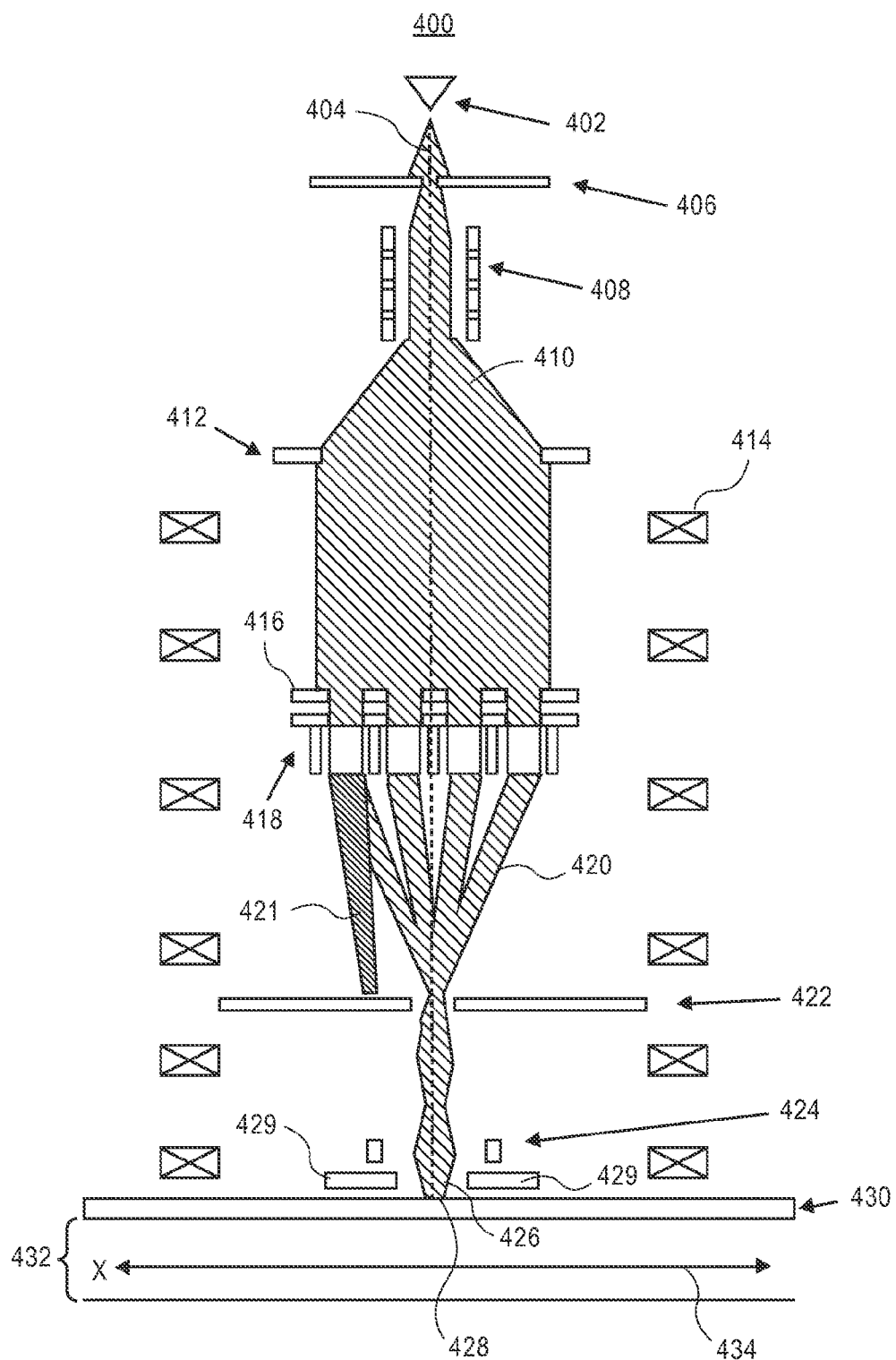
FIG. 4A is a cross-sectional schematic representation of an ebeam column of an electron beam lithography apparatus, in accordance with an embodiment of the present invention, with FIG. 4B illustrating a magnified portion of FIG. 4A and FIG. 4C illustrating a backscattered electron (BSE) pathway through FIG. 4B.

Referring to FIG. 4A, an ebeam column 400 includes an electron source 402 for providing a beam of electrons 404. The beam of electrons 404 is passed through a limiting aperture 406 and, subsequently, through high aspect ratio illumination optics 408. The outgoing beam 410 is then passed through a slit 412 and may be controlled by a slim lens 414, e.g., which may be magnetic. Ultimately, the beam 404 is passed through a shaping aperture 416 (which may be a one-dimensional (1-D) shaping aperture) and then through a blanker aperture array (BAA) 418. The BAA 418 includes a plurality of physical apertures therein, such as openings formed in a thin slice of silicon. It may be the case that only a portion of the BAA 418 is exposed to the ebeam at a given time. Alternatively, or in conjunction, only a portion 420 of the ebeam 404 that passes through the BAA 418 is allowed to pass through a final aperture 422 (e.g., beam portion 421 is shown as blocked) and, possibly, a stage feedback deflector 424.

Referring again to FIG. 4A, the resulting ebeam 426 ultimately passes through a cutout, opening or hole in a back scatter electron (BSE) detector 429 and impinges as a spot 428 on a surface of a wafer 430, such as a silicon wafer used in IC manufacture. Specifically, the resulting ebeam may impinge on a photoresist layer on the wafer, but embodiments are not so limited. A stage scan 432 moves the wafer 430 relative to the beam 426 along the direction of the arrow 434 shown in FIG. 4A. It is to be appreciated that an ebeam tool in its entirely may include numerous columns 400 of the type depicted in FIG. 4A. Also, as described in some embodiments below, the ebeam tool may have an associated base computer, and each column may further have a corresponding column computer.

Figure 4B:
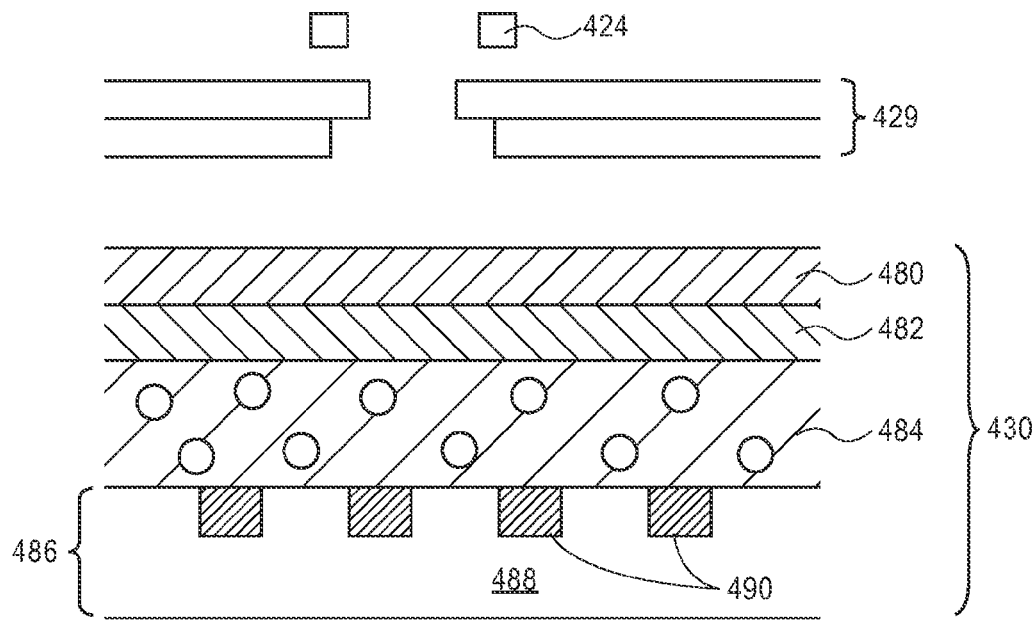
Figure 4C:
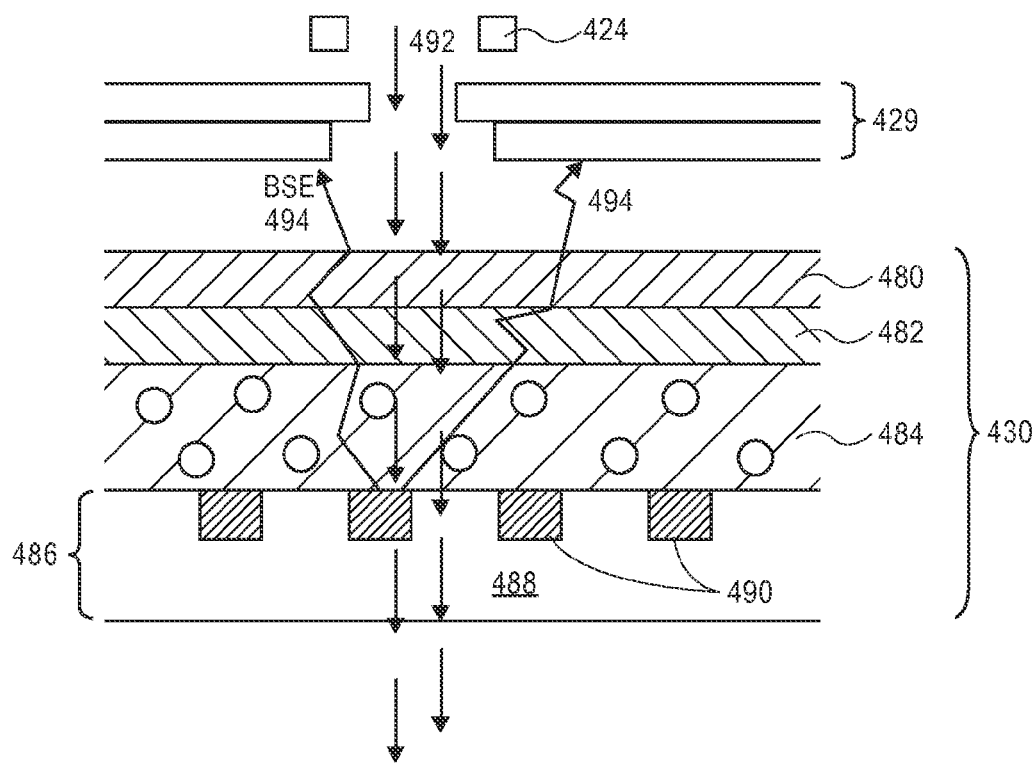

Referring now to FIG. 4B, in accordance with embodiments described herein, a magnified view of the BSE detector 429 and sample 430 is shown. The sample 430 may include, e.g., a resist layer 480, a hardmask 482, an ILD layer 484 (possible representing various ILD/metallization layers) and an alignment layer 486. The alignment layer 486 includes, e.g., metal features 490 in an ILD layer 488, as is depicted in FIG. 4B. It is to be appreciated that the alignment layer 486 may be situated below many more layers than are depicted in FIG. 4A.

Referring now to FIG. 4C, in accordance with embodiments described herein, incoming electrons 492 are introduced to the structure of FIG. 4B. Some of the electrons provide a backscatter electron source 494 from interacting with, e.g., the alignment layer 486. The backscattered electrons 494 may ultimately be detected by the BSE detector 429 to provide alignment information.

One drawback of state-of-the-art e-beam lithography is that it is not readily adoptable into a high volume manufacturing (HVM) environment for advanced integrated circuit manufacturing. Today's e-beam tooling and associated methodology has proven to be too slow with respect to throughput requirements for HVM wafer processing. Embodiments described herein are directed to enabling the use of EBL in an HVM environment. In particular, many embodiments described herein enable improved throughput in an EBL tool to allow for the use of EBL in an HVM environment.

It is to be appreciated that when referring below to openings or apertures in a blanker aperture array (BAA), all or some of the openings or apertures of the BAA can be switched open or "closed" (e.g., by beam deflecting) as the wafer/die moves underneath along a wafer travel or scan direction. In one embodiment, the BAA can be independently controlled as to whether each opening passes the ebeam through to the sample or deflects the beam into, e.g., a Faraday cup or blanking aperture. The ebeam column or apparatus including such a BAA may be built to deflect the overall beam coverage to just a portion of the BAA, and then individual openings in the BAA are electrically configured to pass the ebeam ("on") or not pass ("off"). For example, un-deflected electrons pass through to the wafer and expose a resist layer, while deflected electrons are caught in a stopping aperture of Faraday cup located underneath the blanking aperture within the electron beam column. It is to be appreciated that reference to "openings" or "opening heights" refers to the spot size impinged on the receiving wafer and not to the physical opening in the BAA since the physical openings are substantially larger (e.g., micron scale) than the spot size (e.g., nanometer scale) ultimately generated from the BAA. Thus, when described herein as the pitch of a BAA or column of openings in a BAA being said to "correspond" to the pitch of metal lines, such description actually refers to the relationship between pitch of the impinging spots as generated from the BAA and the pitch of the lines being cut.

It is also to be appreciated that, in some embodiments, an ebeam column as described above may also include other features in addition to those described in association with FIGS. 4A-4C. For example, in an embodiment, the sample stage can be rotated by 90 degrees to accommodate alternating metallization layers which may be printed orthogonally to one another (e.g., rotated between X and Y scanning directions). In another embodiment, an e-beam tool is capable of rotating a wafer by 90 degrees prior to loading the wafer on the stage.

In accordance with an embodiment of the present invention, the conflict between Electron Beam Direct Write (EBDW) exposure tool productivity and its ability to deliver required overlay registration by providing alignment information from an underlying layer needed for precise real time overlay corrections for wafer under exposure. One or more embodiments involve collecting alignment information in real time in hundreds and, if needed, thousands locations on a wafer as an electron beam exposure scanner tool is scanning over the wafer exposing it. No extra time is needed to be spent on collecting wafer alignment information prior to exposure while delivering overlay not otherwise achievable by any other exposure system such as Optical or extreme ultra-violet (EUVL) lithography scanners.

In an embodiment, a backscatter electron (BSE) detector is mounted within electron column(s) (plural in the case of a multi-columns EBDW exposure tool, each column having a BSE detector) at or toward the column end facing the wafer under exposure. It is to be appreciated that collection of a sufficient amount of BSE (those electrons that are backscattered secondary electrons scattered back by both metal and ILD features, for example, that include alignment marks result in set requirements of (a) minimal electron landing energy (for penetration through resist, hardmask, ILD alignment mark films and back to the BSE detector which can involve relatively high ebeam acceleration voltage (e.g., greater than 15 keV and even as high as 50 keV or greater), (b) electron beam current resulting in BSE signal with high signal to noise is needed for accurate assessment of positional information of an alignment mark, and (c) a fast and sensitive BSE detector.

In an embodiment, the BSE detector collects BSE as the EBDW stage having the wafer on it is scanning under electron columns and its BSE detector. Alignment marks are manufactured by previous processing operations that include alternating features which are different from one another with respect to atomic number materials. Such features produce a different number of BSE when illuminated by an incoming electron beam (e.g., the efficiency of BSE $\eta$ show simple dependence on illuminated material atomic number Z $\eta=(\ln(Z))/6-0.25)$. Thus, an alignment mark based on a single embedded feature as well as periodic or aperiodic features made from materials with sufficiently different atomic numbers Z will produce alternating numbers of BSE when illuminated by the EBDW exposure beam. The alternating numbers of BSE enables for detection and positional interpretation with respect to alignment mark signal contrast. In an embodiment, placing multiple alignment marks on a wafer enables collection of such a signal and its use for real time write positional correction at multiple locations on a wafer without any loss of time and productivity of the EBDW tool during an EBDW exposure sequence. Throughout, embodiments described herein may be referred to Alignment On The Fly (AOTF).

To provide context, EBDW uses an exposure field that is billions of times smaller than other exposure tools (cf. optical or EUVL). Consequently, EBDW has the ability to interrogate (illuminate while exposing field and get response from alignment mark) without exposing important features nearby either within a wafer scribe line or within product die itself depending where alignment marks are placed by previous process operations. Such function is not and cannot be made available on any other Optical or EUVL exposure tool that use much larger field to illuminate alignment marks.

Figure 5:
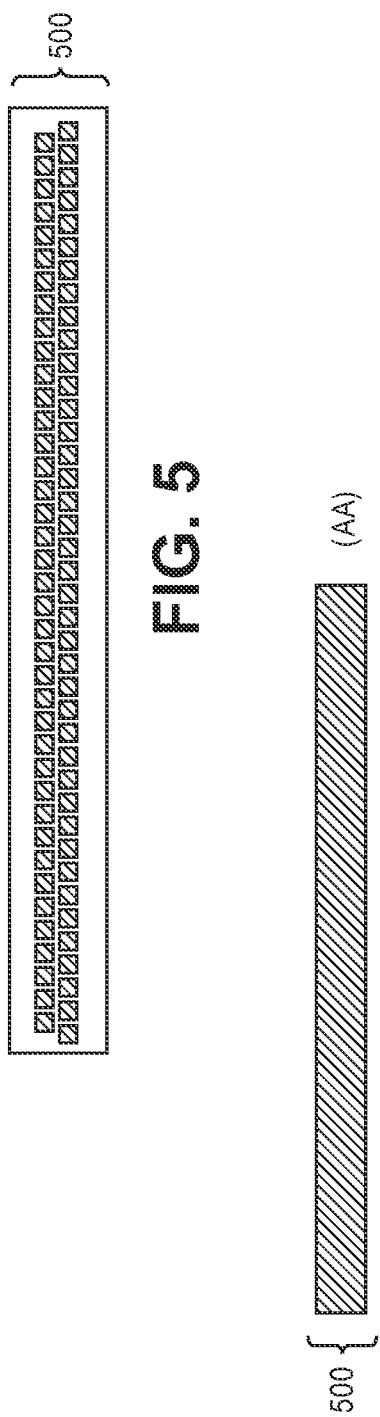
FIG. 5 illustrates an aperture array (AA) for an EBDW tool, in accordance with an embodiment of the present invention.

In an embodiment, an EBDW tool uses rows of small rectangular individually controlled apertures. In an example, FIG. 5 illustrates an aperture array (AA) 500 for an EBDW tool, in accordance with an embodiment of the present invention. Referring to FIG. 5, the aperture array 500 permits an electron beam to propagate through an electron beam column or be deflected and absorbed by an electron trap in the column. The dimension of every individual aperture at the wafer plan are on the order of electron beam resolution limit. In the example herein, every individual aperture is a rectangle of 9 nm×9 nm.

Figure 6:
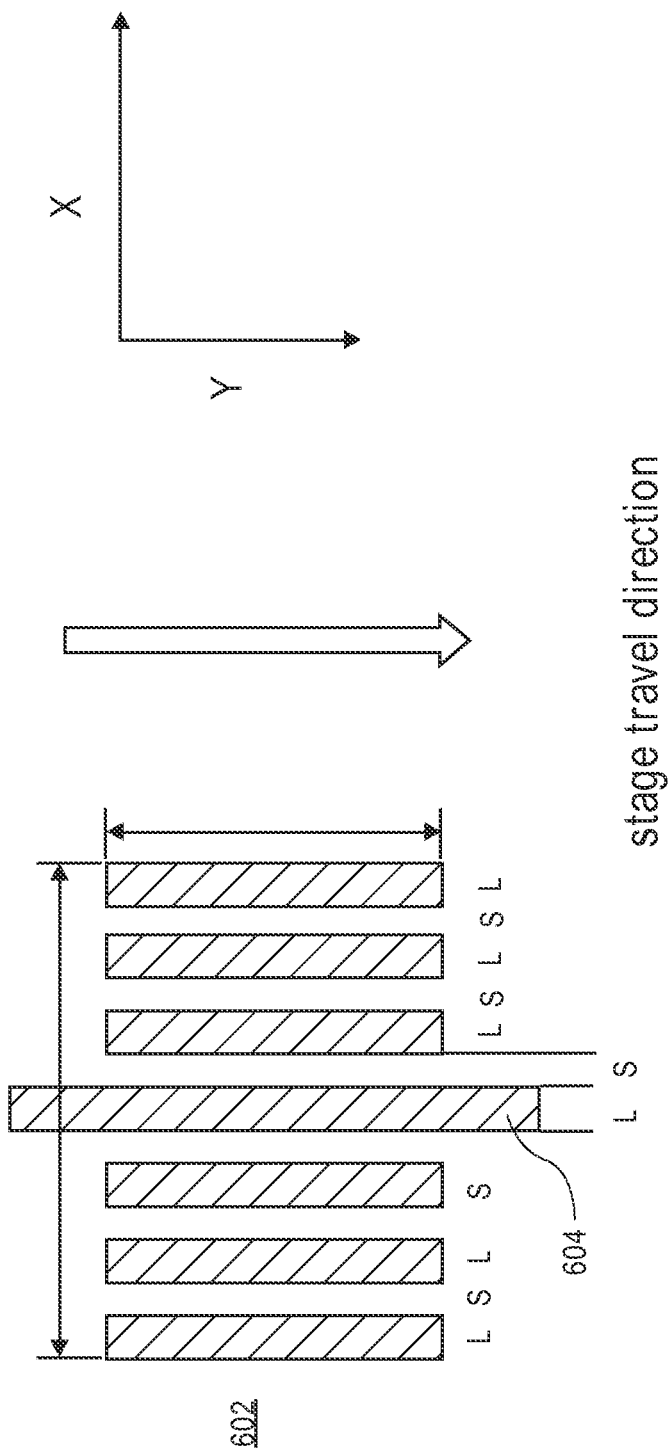
FIG. 6 illustrates an EBDW tool stage moving in the Y direction under tool columns (s) electron beams propagating through aperture arrays (AA), in accordance with an embodiment of the present invention.

In an embodiment, an alignment mark formed by preceding processing operations on the wafer on a layer for alignment to may look like one shown for example in FIG. 6. Referring to FIG. 6, an EBDW tool stage moves in the Y direction under tool columns (s) electron beams propagating through aperture arrays (AA) 500. As the EBDW tool stage moves in the Y direction under tool columns (s) electron beams propagating through aperture arrays (AA) "write" a latent image in resist on the wafer.

When an electron image of the AA apertures 500 is projected over Alignment Mark X Alignment features 602, the image of AA is swept by the electron column deflector field in X. In an example, Alignment Mark X Alignment features 602 includes an arrangement of lines (L) and spaces (S) in the X-direction. As described in greater detail below, the Alignment Mark X Alignment features 602 may include a single longer line 604, as is also depicted in FIG. 6.

Figure 7C:
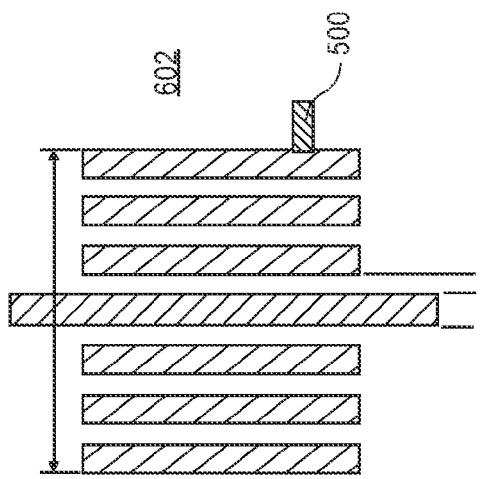
FIGS. 7A-7C illustrate an electron column X-deflector as it moves the image of AA on X across an X-Alignment Mark, in accordance with an embodiment of the present invention.
Figure 7B:
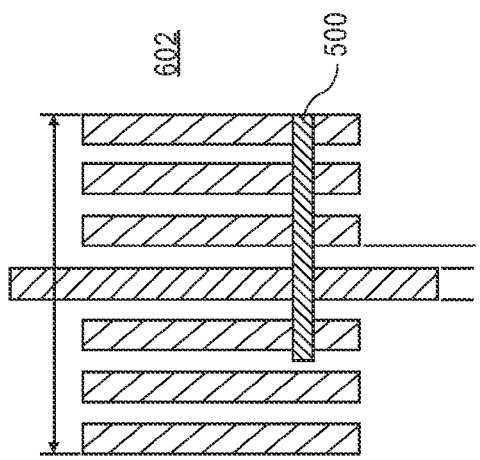
Figure 7A:
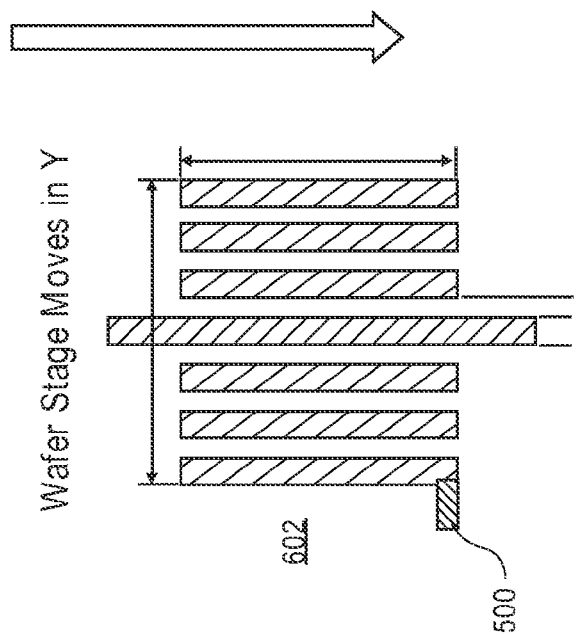

FIGS. 7A-7C illustrate an electron column X-deflector as it moves the image of AA on X across an X-Alignment Mark, in accordance with an embodiment of the present invention. Referring to FIGS. 7A-7C, as the AA electron image from 500 is swept in X over X-Alignment mark 602, it sequentially illuminates scattering bars and separating spaces.

Figure 8B:
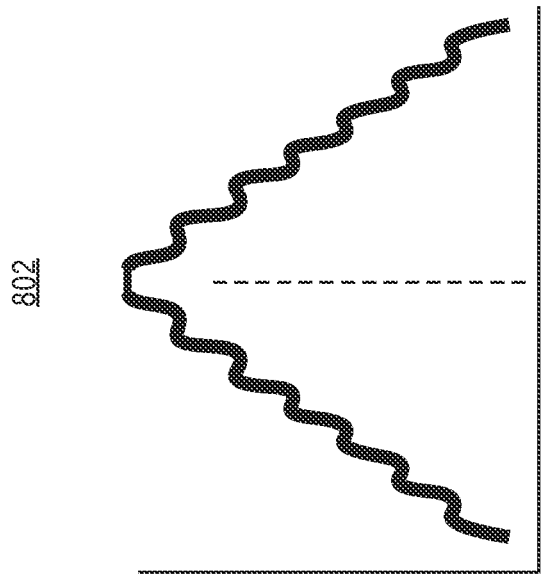
FIGS. 8A and 8B illustrate a backscatter electron (BSE) detector response, in accordance with an embodiment of the present invention.
Figure 8A:
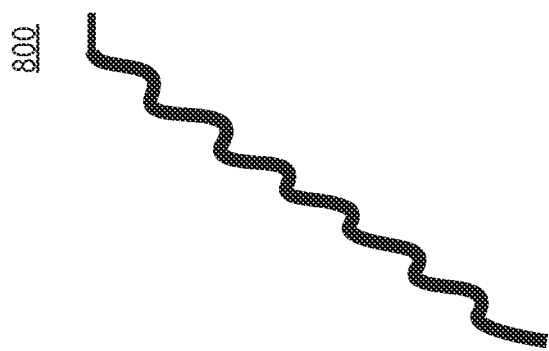

FIGS. 8A and 8B illustrate a BSE detector response, in accordance with an embodiment of the present invention. In an embodiment, as the electron image of AA continues to sweep over X alignment mark, a descending ramp staircase signal will be produced on the electron column BSE detector. A time resolved BSE detection response waveform 800 (and ultimately 802) results in characteristic ascending ramped staircase waveform until all scattering bars are illuminated simultaneously, as shown in FIGS. 8A and 8B, respectively.

Figure 9:
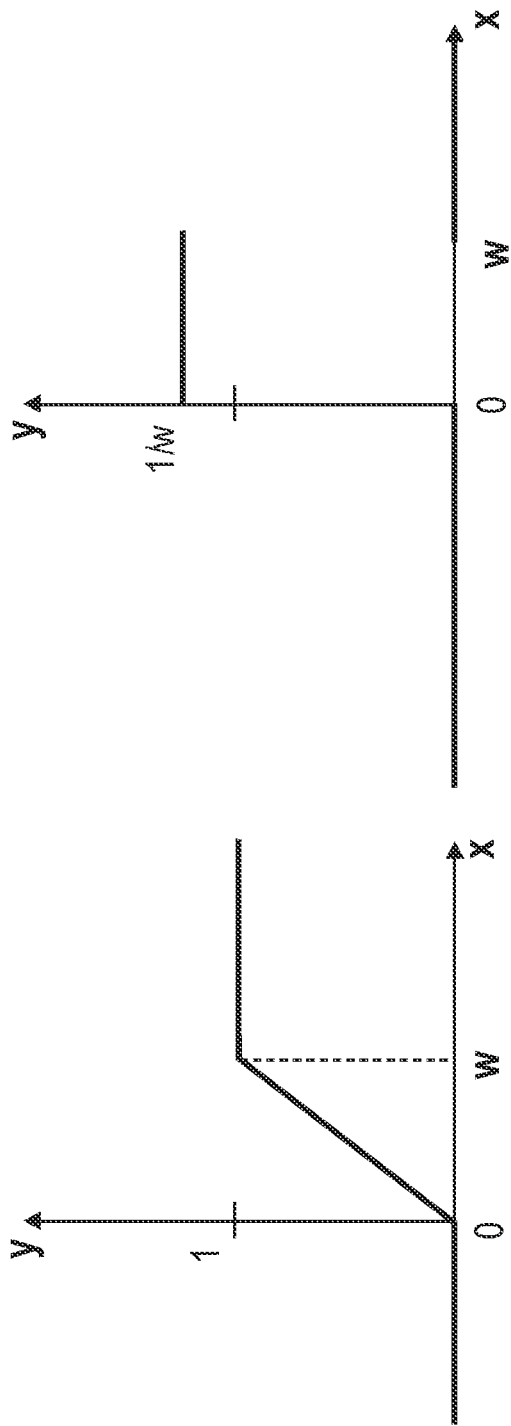
FIG. 9 illustrates determination of an X-position of every edge of every feature forming the X Alignment Mark as well as the overall X Alignment Mark by calculating the BSE detector signal derivative, in accordance with an embodiment of the present invention.

Having a ramped staircase BSE detector signal from X Alignment Mark allows determination of an X-position of every edge of every feature forming the X Alignment Mark as well as the overall X Alignment Mark by calculating the BSE detector signal derivative, as is shown in FIG. 9.

As mentioned above with respect to line 604 of FIG. 6, in an embodiment, the X-direction alignment feature 602 further includes a Y-direction alignment aspect. In one such embodiment, the Y-direction alignment aspect is a single longest line of the X-direction alignment feature.

In an embodiment, an electron column Y-deflector is used to sweep an electron beam produced by an image of AA along the same position on the X Alignment mark. In general, multiple X-deflector sweeps are performed while the stage moves in the Y direction to collect a maximum number of information from a given X-alignment mark and employ signal averaging for the purpose of Signal/Noise enhancement. For a Y alignment mark, the AA is static while the stage moves. The Y alignment mark is moving under electron beams propagated through AA 500.

Figure 10:
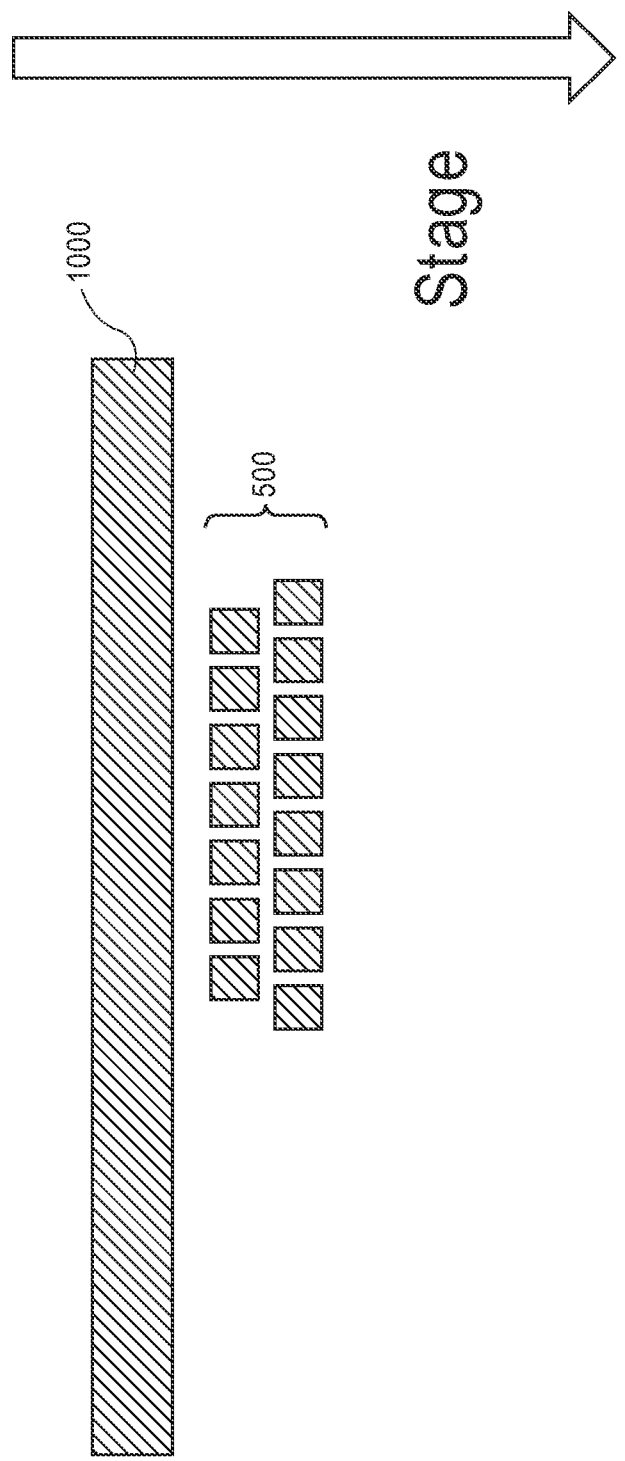
FIG. 10 illustrates stage movement for a Y-alignment mark, in accordance with an embodiment of the present invention.

As the wafer stage continues to move in Y, and X-Alignment Mark leaves a range of illumination by AA 500 the Y-alignment mark will come into the illumination range of AA. No deflection is necessary to collect alignment information from a single bar 1000 made from material with different atomic number Z, as shown in FIG. 10. FIG. 10 illustrates stage movement for a Y-alignment mark, in accordance with an embodiment of the present invention. A Y-Alignment Mark may appear the same as an X-Alignment mark but rotated by 90 degrees. Given Y Alignment Mark heights h is sufficiently larger than AA heights, the depicted arrangement is a simple representation of a knife edge technique. The derivative of the BSE detector signal will be a Gaussian with parameters defined by Y-Mark edge positions.

It is to be appreciated that the examples of alignment marks are periodic in the x-direction in that the lines have a same width and that the spacings between the lines have a same width. In other embodiments, an aperiodic alignment mark structure (in the X-direction) may be used. As an example, FIG. 11 illustrates an aperiodic alignment structure and corresponding backscatter electron (BSE) detector response, in accordance with an embodiment of the present invention.

Figure 11:
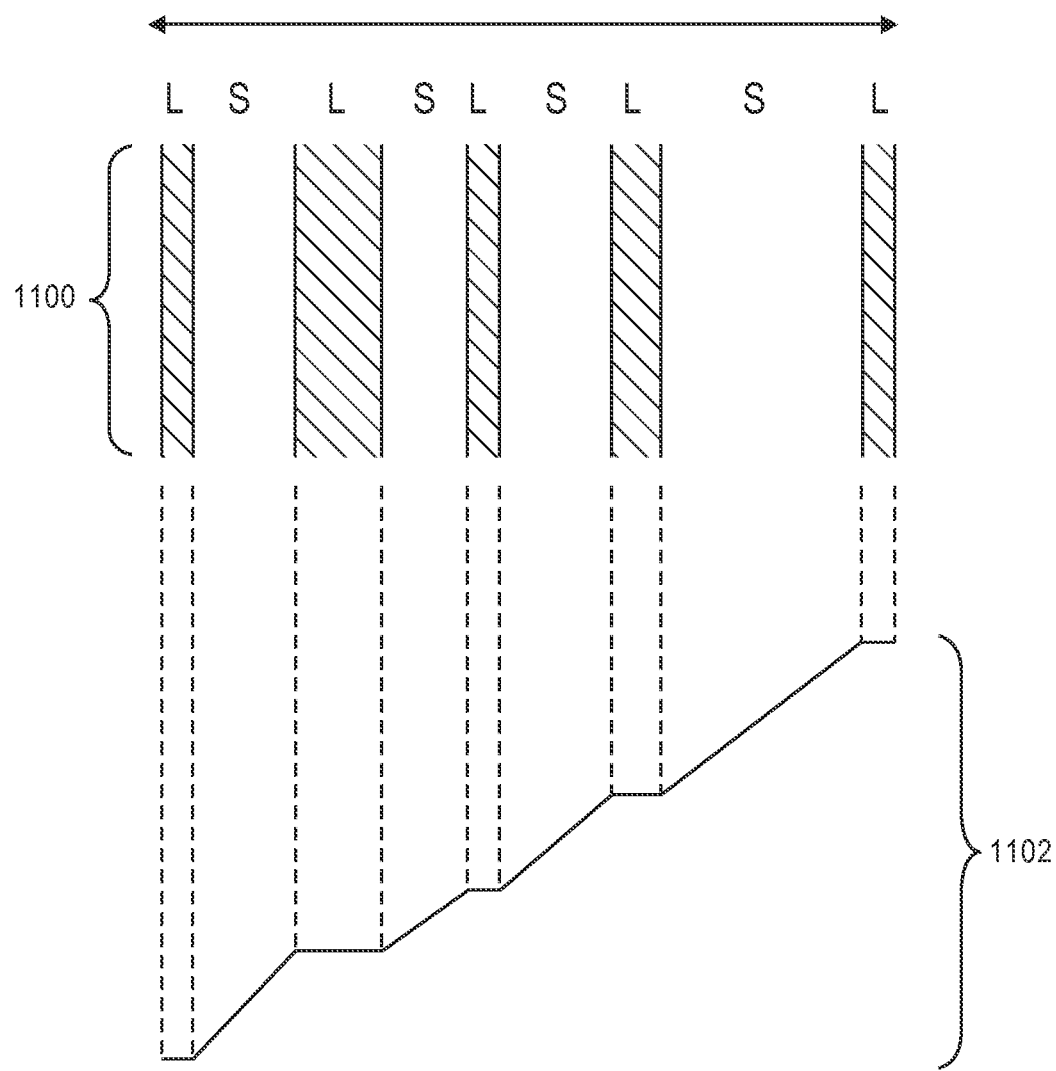
FIG. 11 illustrates an aperiodic alignment structure and corresponding backscatter electron (BSE) detector response, in accordance with an embodiment of the present invention.

Referring to FIG. 11, an aperiodic alignment structure 1100 includes a plurality of lines (L) and spaces (S). In one embodiment, the widths of the lines (L) vary across the aperiodic alignment structure 1100. In one embodiment, the widths of the spacings (S) between lines (L) vary across the aperiodic alignment structure 1100. In one embodiment, both the widths of the lines (L) vary across the aperiodic alignment structure 1100 and the widths of the spacings (S) between lines (L) vary across the aperiodic alignment structure 1100, as is depicted in FIG. 11. Referring again to FIG. 11, a time resolved BSE detection response waveform 1102 correlates to the aperiodic alignment structure 1100.

In another aspect, alignment marks such as those described above are present in a completed semiconductor die. Such marks are significantly smaller than a conventional optical alignment mark. For example, alignment marks contemplated herein may be on the scale of about 500 times smaller than a conventional optical alignment mark, e.g., on the nanometer scale instead of the micron scale. In an embodiment, a semiconductor die includes a substrate. A non-optical alignment mark is disposed in or above the substrate. The non-optical alignment mark includes an X-direction alignment feature. Such a non-optical alignment mark could be included within one or more drop-in cells on a die. It is also to be appreciated that such an alignment mark could be extended along the Y-direction and may be substantially break-free (i.e., large scale breaks along the Y-direction as are otherwise used in optical alignment marks are avoided in alignment marks contemplated herein).

In one embodiment, the X-direction alignment feature of the non-optical alignment mark is periodic. In one embodiment, the X-direction alignment feature of the non-optical alignment mark is aperiodic. In one embodiment, the non-optical alignment mark further includes a Y-direction alignment feature. In one embodiment, the Y-direction alignment feature is a single longest line of the X-direction alignment feature. In one embodiment, the non-optical alignment mark is disposed in the substrate. In one embodiment, the non-optical alignment mark is disposed in a layer disposed above the substrate.

In general, it is to be appreciated that the very mature field of Scanning Electron Microscopy uses BSE and contrast between different materials for BSE efficiency to produce an image of features illuminated by an electron beam. In accordance with embodiments herein, similar physics is employed for alignment on the fly for EBDW tools. In an embodiment, alignment is needed as a result of ebeam wander or wafer expansion or both. In an embodiment, misalignment information is used for alignment of an ebeam column in a feed forward mechanism.

In an exemplary embodiment, a method of fine alignment of an e-beam tool includes projecting an electron image of a plurality of apertures of an e-beam column over an X-direction alignment feature of a wafer while moving the wafer along the Y-direction. A time-resolved back-scattered electron (BSE) detection response waveform is detected during the projecting. An X-position of every edge of every feature of the X-direction alignment feature is determined by calculating a derivative of the BSE detection response waveform. Subsequent to determining an X-position of every edge of every feature of the X-direction alignment feature, an alignment of the e-beam column to the wafer is adjusted.

In one embodiment, projecting the electron image of the plurality of apertures of the e-beam column over the X-direction alignment feature of the wafer involves projecting the electron image over a periodic X-direction alignment feature. In one embodiment, projecting the electron image of the plurality of apertures of the e-beam column over the X-direction alignment feature of the wafer involves projecting the electron image over an aperiodic X-direction alignment feature. In one embodiment, the X-direction alignment feature further includes a Y-direction alignment aspect. The method further involves determining a Y-position of the X-direction alignment feature. In one embodiment, determining the Y-position of the X-direction alignment feature involves detecting the position of a single longest line of the X-direction alignment feature while moving the wafer along the Y-direction.

With reference again to FIGS. 4A-4C, in an embodiment, a column 400 for an e-beam tool includes an electron source 402 for providing a beam of electrons 404. A limiting aperture 406 is coupled with the electron source along a pathway of the beam of electrons. High aspect ratio illumination optics 408 are coupled with the limiting aperture 406 along the pathway of the beam of electrons 404. A shaping aperture 416 is coupled with the high aspect ratio illumination optics 408 along the pathway of the beam of electrons 404. A blanker aperture array (BAA) 418 is coupled with the shaping aperture 416 along the pathway of the beam of electrons 404. A final aperture 422 is coupled with the BAA 418 along the pathway of the beam of electrons 404. A sample stage is included for receiving the beam of electrons. An electron detector is included for collecting backscattered electrons from an X-direction alignment feature of a wafer on the sample stage while moving the wafer along the Y-direction.

In one embodiment, the electron detector is configured to determine an X-position of every edge of every feature of the X-direction alignment feature by calculating a derivative of the BSE detection response waveform. In one embodiment, the X-direction alignment feature further includes a Y-direction alignment aspect, and the electron detector is further configured to determine a Y-position of the X-direction alignment feature. In one embodiment, the electron detector is configured to adjust an alignment of the e-beam column to the wafer. In one embodiment, the X-direction alignment feature of the wafer is a periodic X-direction alignment feature. In one embodiment, the X-direction alignment feature of the wafer is an aperiodic X-direction alignment feature.

More generally, referring to all of the above aspects of embodiments of the present invention, it is to be appreciated that a metallization layer having lines with line cuts (or plugs) and having associated vias may be fabricated above a substrate and, in one embodiment, may be fabricated above a previous metallization layer. As an example, FIG. 12 illustrates a plan view and corresponding cross-sectional view of a previous layer metallization structure, in accordance with an embodiment of the present invention. Referring to FIG. 12, a starting structure 1200 includes a pattern of metal lines 1202 and interlayer dielectric (ILD) lines 1204. The starting structure 1200 may be patterned in a grating-like pattern with metal lines spaced at a constant pitch and having a constant width, as is depicted in FIG. 12. Although not shown, the lines 1202 may have interruptions (i.e., cuts or plugs) at various locations along the lines. The pattern, for example, may be fabricated by a pitch halving or pitch quartering approach, as described above. Some of the lines may be associated with underlying vias, such as line 1202' shown as an example in the cross-sectional view.

In an embodiment, fabrication of a metallization layer on the previous metallization structure of FIG. 12 begins with formation of an interlayer dielectric (ILD) material above the structure 1200. A hardmask material layer may then be formed on the ILD layer. The hardmask material layer may be patterned to form a grating of unidirectional lines orthogonal to the lines 1202 of 1200. In one embodiment, the grating of unidirectional hardmask lines is fabricated using conventional lithography (e.g., photoresist and other associated layers) and may have a line density defined by a pitch-halving, pitch-quartering etc. approach as described above. The grating of hardmask lines leaves exposed a grating region of the underlying ILD layer. It is these exposed portions of the ILD layer that are ultimately patterned for metal line formation, via formation, and plug formation. For example, in an embodiment, via locations are patterned in regions of the exposed ILD using EBL as described above. The patterning may involve formation of a resist layer and patterning of the resist layer by EBL to provide via opening locations which may be etched into the ILD regions. The lines of overlying hardmask can be used to confine the vias to only regions of the exposed ILD, with overlap accommodated by the hardmask lines which can effectively be used as an etch stop. Plug (or cut) locations may also be patterned in exposed regions of the ILD, as confined by the overlying hardmask lines, in a separate EBL processing operation. The fabrication of cuts or plugs effectively preserve regions of ILD that will ultimately interrupt metal lines fabricated therein. Metal lines may then be fabricated using a damascene approach, where exposed portions of the ILD (those portions between the hardmask lines and not protected by a plug preservation layer, such as a resist layer patterned during "cutting" or breaking of continuity) are partially recessed. The recessing may further extend the via locations to open metal lines from the underlying metallization structure. The partially recessed ILD regions are then filled with metal (a process which may also involve filling the via locations), e.g., by plating and CMP processing, to provide metal lines between the overlying hardmask lines. The hardmask lines may ultimately be removed for completion of a metallization structure. It is to be appreciated that the above ordering of line cuts, via formation, and ultimate line formation is provided only as an example. A variety of processing schemes may be accommodated using EBL cuts and vias, as described herein.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, interconnect material is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect.

In an embodiment, as is also used throughout the present description, hardmask materials are composed of dielectric materials different from the interlayer dielectric material. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

It is to be appreciated that the layers and materials described in association with FIG. 12 are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIG. 8 may be fabricated on underlying lower level interconnect layers.

In another embodiment, EBL cuts may be used to fabricate semiconductor devices, such as PMOS or NMOS devices of an integrated circuit. In one such embodiment, EBL cuts are used to pattern a grating of active regions that are ultimately used to form fin-based or trigate structures. In another such embodiment, EBL cuts are used to pattern a gate layer, such as a poly layer, ultimately used for gate electrode fabrication. As an example of a completed device, FIGS. 13A and 13B illustrate a cross-sectional view and a plan view (taken along the a-a' axis of the cross-sectional view), respectively, of a non-planar semiconductor device having a plurality of fins, in accordance with an embodiment of the present invention.

Figure 13A:
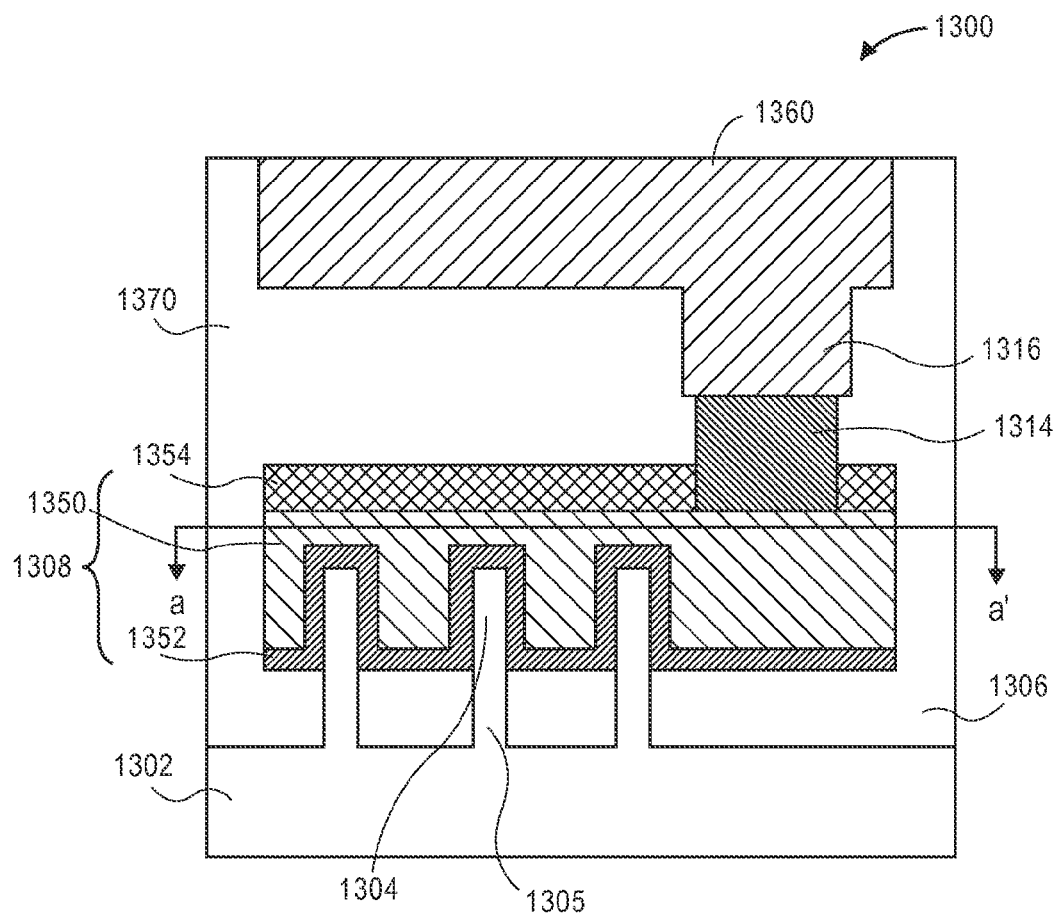
FIG. 13A illustrates a cross-sectional view of a non-planar semiconductor device having fins, in accordance with an embodiment of the present invention.

Referring to FIG. 13A, a semiconductor structure or device 1300 includes a non-planar active region (e.g., a fin structure including protruding fin portion 1304 and sub-fin region 1305) formed from substrate 1302, and within isolation region 1306. A gate line 1308 is disposed over the protruding portions 1304 of the non-planar active region as well as over a portion of the isolation region 1306. As shown, gate line 1308 includes a gate electrode 1350 and a gate dielectric layer 1352. In one embodiment, gate line 1308 may also include a dielectric cap layer 1354. A gate contact 1314, and overlying gate contact via 1316 are also seen from this perspective, along with an overlying metal interconnect 1360, all of which are disposed in inter-layer dielectric stacks or layers 1370. Also seen from the perspective of FIG. 13A, the gate contact 1314 is, in one embodiment, disposed over isolation region 1306, but not over the non-planar active regions.

Figure 13B:
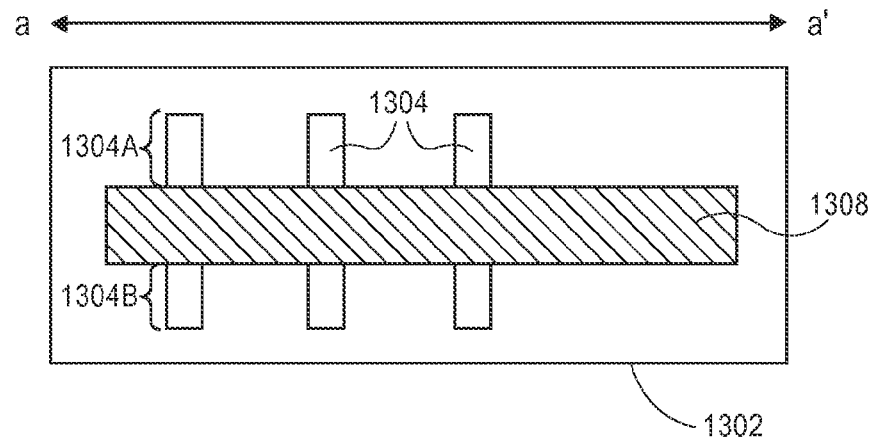
FIG. 13B illustrates a plan view taken along the a-a' axis of the semiconductor device of FIG. 13A, in accordance with an embodiment of the present invention.

Referring to FIG. 13B, the gate line 1308 is shown as disposed over the protruding fin portions 1304. Source and drain regions 1304A and 1304B of the protruding fin portions 1304 can be seen from this perspective. In one embodiment, the source and drain regions 1304A and 1304B are doped portions of original material of the protruding fin portions 1304. In another embodiment, the material of the protruding fin portions 1304 is removed and replaced with another semiconductor material, e.g., by epitaxial deposition. In either case, the source and drain regions 1304A and 1304B may extend below the height of dielectric layer 1306, i.e., into the sub-fin region 1305.

In an embodiment, the semiconductor structure or device 1300 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 1308 surround at least a top surface and a pair of sidewalls of the three-dimensional body.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 14:
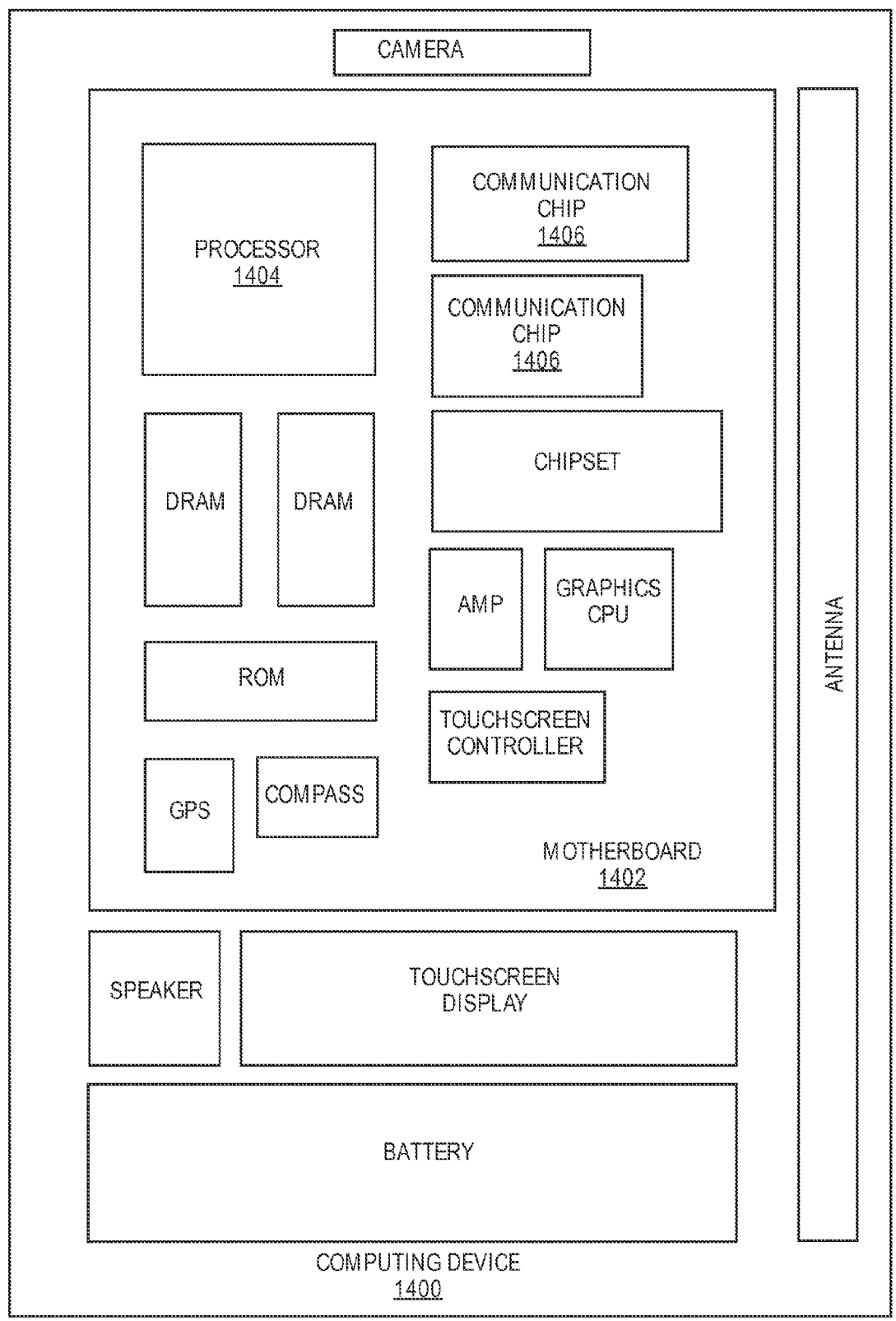
FIG. 14 illustrates a computing device in accordance with one implementation of the invention.

FIG. 14 illustrates a computing device 1400 in accordance with one implementation of the invention. The computing device 1400 houses a board 1402. The board 1402 may include a number of components, including but not limited to a processor 1404 and at least one communication chip 1406. The processor 1404 is physically and electrically coupled to the board 1402. In some implementations the at least one communication chip 1406 is also physically and electrically coupled to the board 1402. In further implementations, the communication chip 1406 is part of the processor 1404.

Depending on its applications, computing device 1400 may include other components that may or may not be physically and electrically coupled to the board 1402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1406 enables wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1400 may include a plurality of communication chips 1406. For instance, a first communication chip 1406 may be dedicated to shorter range wireless communications such as Wi-Fi and Bluetooth and a second communication chip 1406 may be dedicated to longer range wireless communications such as GPS, EDGE, GPRS, CDMA, WiMAX, LTE, Ev-DO, and others.

The processor 1404 of the computing device 1400 includes an integrated circuit die packaged within the processor 1404. In some implementations of the invention, the integrated circuit die of the processor includes one or more structures fabricated using CEBL, in accordance with implementations of embodiments of the invention. The term "processor" may refer to any device or portion of a device that processes electronic data from registers and/or memory to transform that electronic data into other electronic data that may be stored in registers and/or memory.

The communication chip 1406 also includes an integrated circuit die packaged within the communication chip 1406. In accordance with another implementation of embodiments of the invention, the integrated circuit die of the communication chip includes one or more structures fabricated using CEBL, in accordance with implementations of embodiments of the invention.

In further implementations, another component housed within the computing device 1400 may contain an integrated circuit die that includes one or more structures fabricated using CEBL, in accordance with implementations of embodiments of the invention.

In various implementations, the computing device 1400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1400 may be any other electronic device that processes data.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with an ebeam tool such as described in association with FIGS. 4A-4C. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 15:
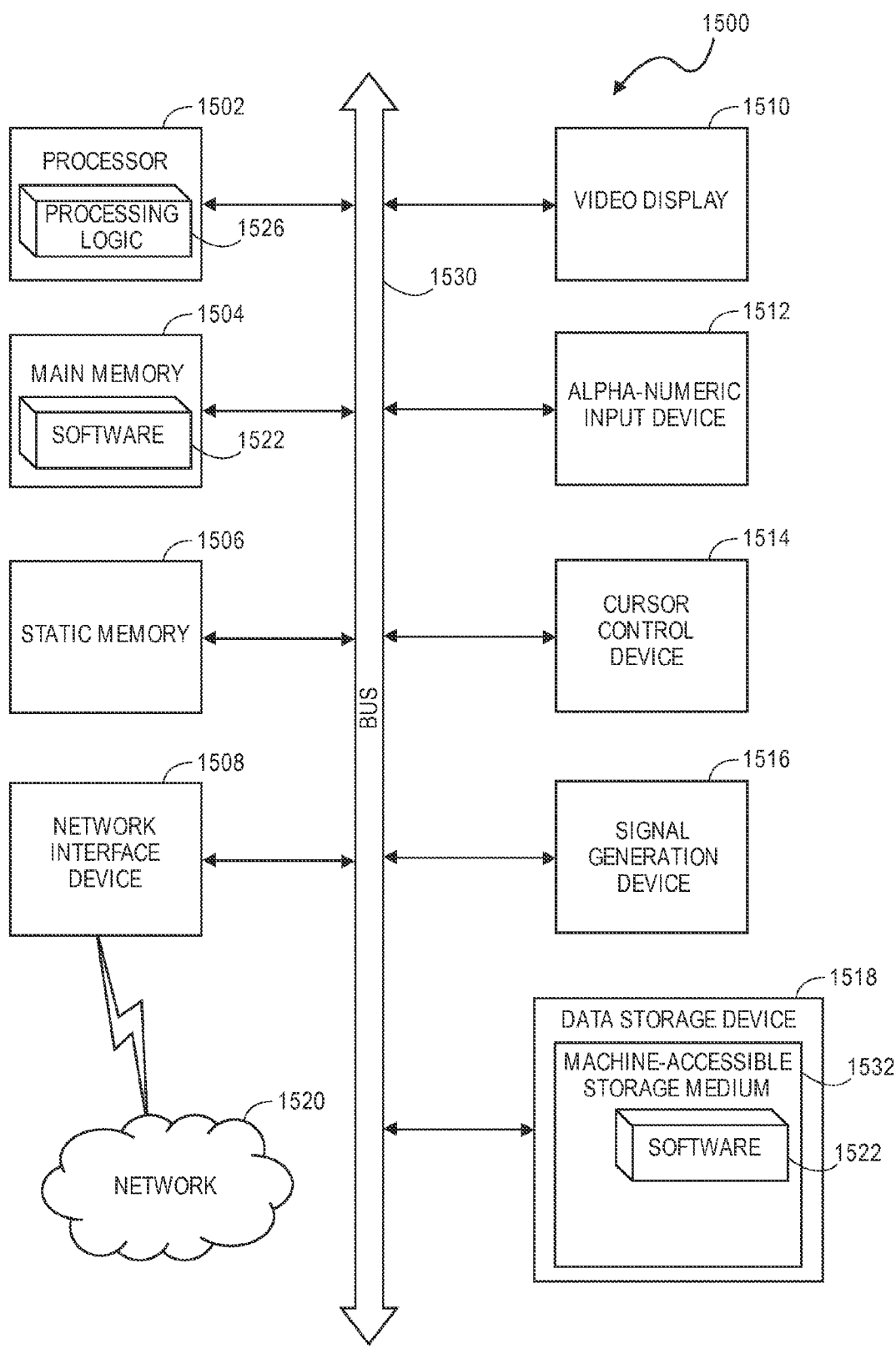
FIG. 15 illustrates a block diagram of an exemplary computer system, in accordance with an embodiment of the present invention.

FIG. 15 illustrates a diagrammatic representation of a machine in the exemplary form of a computer system 1500 within which a set of instructions, for causing the machine to perform any one or more of the methodologies described herein (such as end-point detection), may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1500 includes a processor 1502, a main memory 1504 (e.g., read-only memory (ROM), flash memory, dynamic random access memory (DRAM) such as synchronous DRAM (SDRAM) or Rambus DRAM (RDRAM), etc.), a static memory 1506 (e.g., flash memory, static random access memory (SRAM), etc.), and a secondary memory 1518 (e.g., a data storage device), which communicate with each other via a bus 1530.

Processor 1502 represents one or more general-purpose processing devices such as a microprocessor, central processing unit, or the like. More particularly, the processor 1502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1502 may also be one or more special-purpose processing devices such as an application specific integrated circuit (ASIC), a field programmable gate array (FPGA), a digital signal processor (DSP), network processor, or the like. Processor 1502 is configured to execute the processing logic 3826 for performing the operations described herein.

The computer system 1500 may further include a network interface device 1508. The computer system 1500 also may include a video display unit 1510 (e.g., a liquid crystal display (LCD), a light emitting diode display (LED), or a cathode ray tube (CRT)), an alphanumeric input device 1512 (e.g., a keyboard), a cursor control device 3814 (e.g., a mouse), and a signal generation device 1516 (e.g., a speaker).

The secondary memory 1518 may include a machine-accessible storage medium (or more specifically a computer-readable storage medium) 1532 on which is stored one or more sets of instructions (e.g., software 1522) embodying any one or more of the methodologies or functions described herein. The software 1522 may also reside, completely or at least partially, within the main memory 1504 and/or within the processor 1502 during execution thereof by the computer system 1500, the main memory 1504 and the processor 1502 also constituting machine-readable storage media. The software 1522 may further be transmitted or received over a network 1520 via the network interface device 1508.

While the machine-accessible storage medium 1532 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In an embodiment, a non-transitory machine-accessible storage medium has instructions stored thereon which cause a data processing system to perform a method of real-time alignment of a wafer situated on a stage of an e-beam tool. The method includes projecting an electron image of a plurality of apertures of an e-beam column over an X-direction alignment feature of a wafer while moving the wafer along the Y-direction. The method also includes detecting a time-resolved back-scattered electron (BSE) detection response waveform during the projecting. The method also includes determining an X-position of every edge of every feature of the X-direction alignment feature by calculating a derivative of the BSE detection response waveform. The method also includes, subsequent to determining an X-position of every edge of every feature of the X-direction alignment feature, adjusting an alignment of the e-beam column to the wafer.

In one embodiment, projecting the electron image of the plurality of apertures of the e-beam column over the X-direction alignment feature of the wafer involves projecting the electron image over a periodic X-direction alignment feature. In one embodiment, projecting the electron image of the plurality of apertures of the e-beam column over the X-direction alignment feature of the wafer involves projecting the electron image over an aperiodic X-direction alignment feature. In one embodiment, the X-direction alignment feature further includes a Y-direction alignment aspect. The method further involves determining a Y-position of the X-direction alignment feature. In one embodiment, determining the Y-position of the X-direction alignment feature involves detecting the position of a single longest line of the X-direction alignment feature while moving the wafer along the Y-direction.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (Sift) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 16:
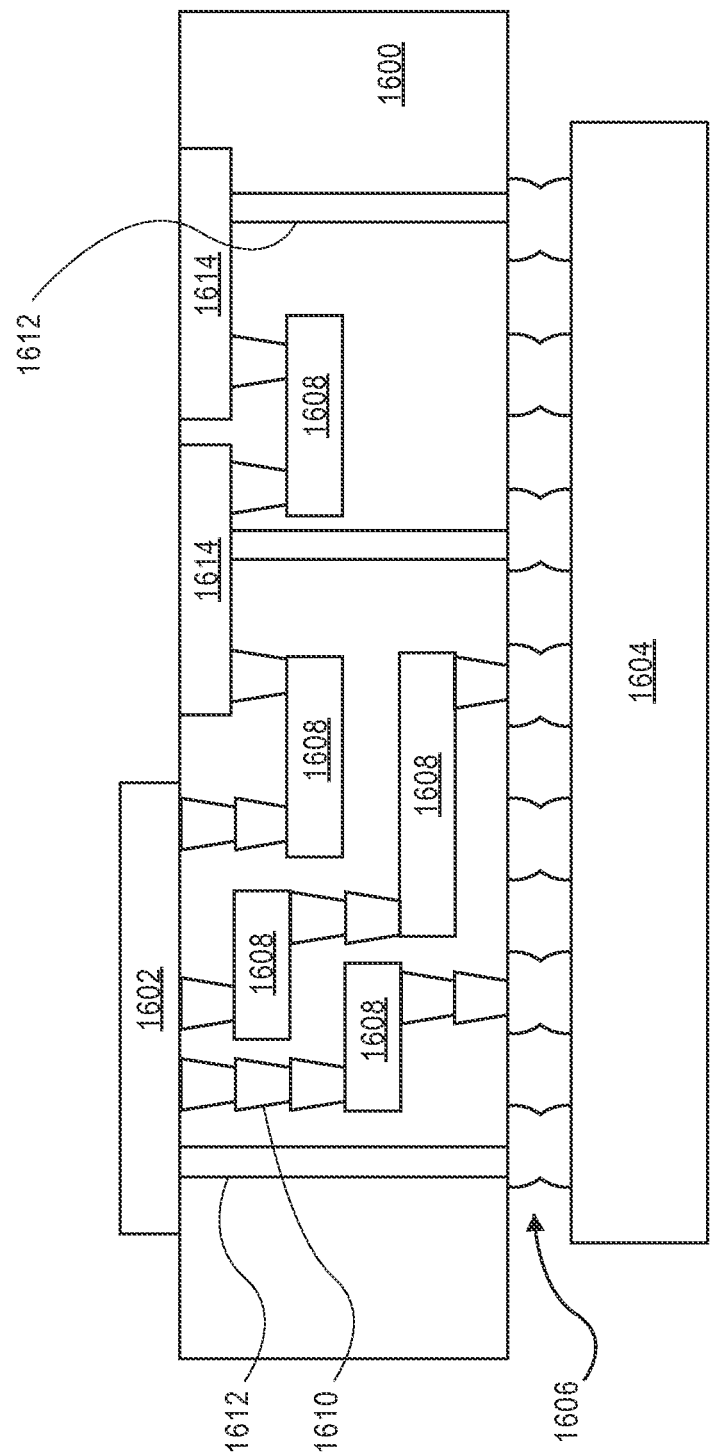
FIG. 16 is an interposer implementing one or more embodiments of the invention.

FIG. 16 illustrates an interposer 1600 that includes one or more embodiments of the invention. The interposer 1600 is an intervening substrate used to bridge a first substrate 1602 to a second substrate 1604. The first substrate 1602 may be, for instance, an integrated circuit die. The second substrate 1604 may be, for instance, a memory module, a computer motherboard, or another integrated circuit die. Generally, the purpose of an interposer 1600 is to spread a connection to a wider pitch or to reroute a connection to a different connection. For example, an interposer 1600 may couple an integrated circuit die to a ball grid array (BGA) 1606 that can subsequently be coupled to the second substrate 1604. In some embodiments, the first and second substrates 1602/1604 are attached to opposing sides of the interposer 1600. In other embodiments, the first and second substrates 1602/1604 are attached to the same side of the interposer 1600. And in further embodiments, three or more substrates are interconnected by way of the interposer 1600.

The interposer 1600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1608 and vias 1610, including but not limited to through-silicon vias (TSVs) 1612. The interposer 1600 may further include embedded devices 1614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1600.

In accordance with embodiments of the invention, apparatuses or processes disclosed herein may be used in the fabrication of interposer 1600.

Figure 17:
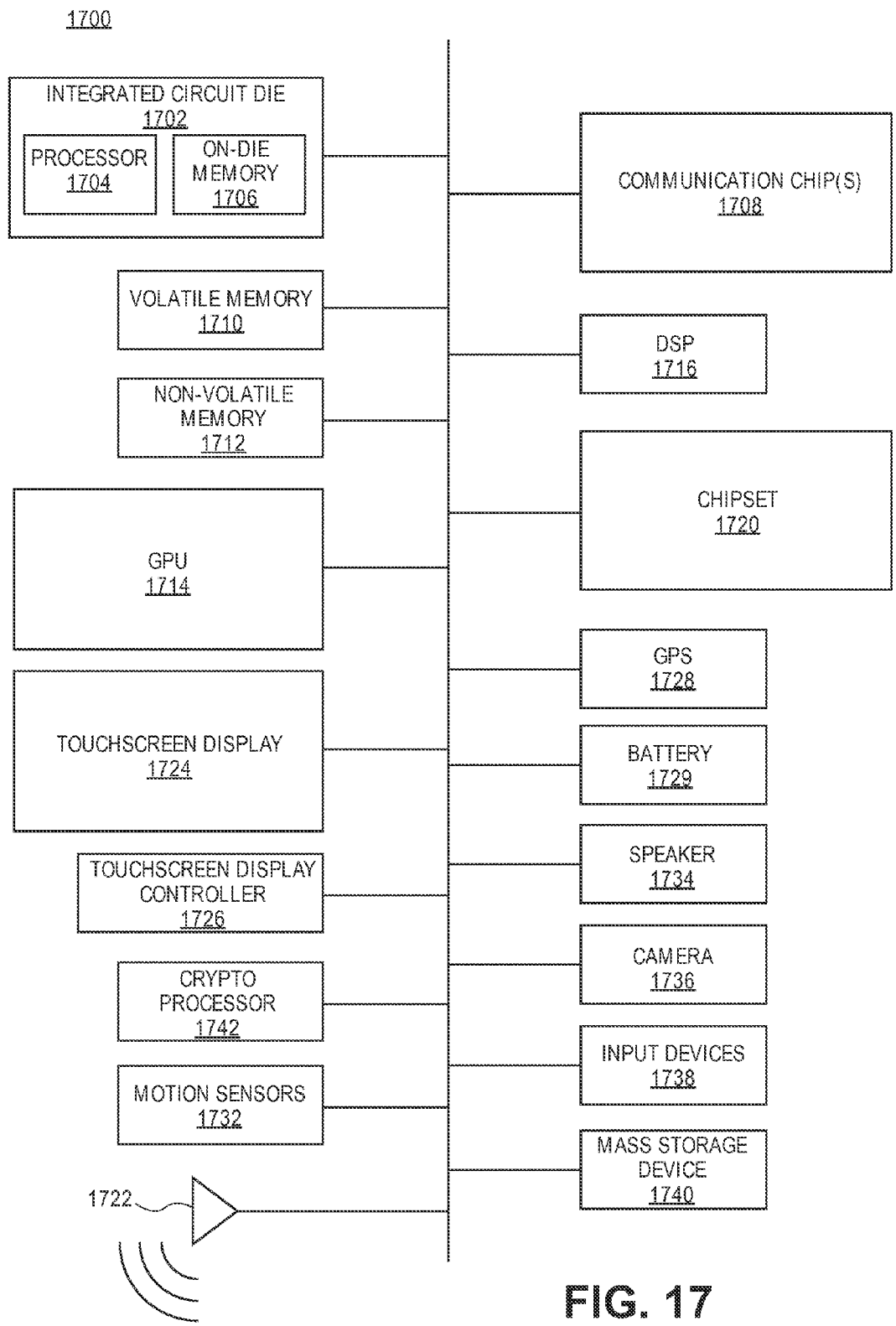
FIG. 17 is a computing device built in accordance with an embodiment of the invention.

FIG. 17 illustrates a computing device 1700 in accordance with one embodiment of the invention. The computing device 1700 may include a number of components. In one embodiment, these components are attached to one or more motherboards. In an alternate embodiment, these components are fabricated onto a single system-on-a-chip (SoC) die rather than a motherboard. The components in the computing device 1700 include, but are not limited to, an integrated circuit die 1702 and at least one communication chip 1708. In some implementations the communication chip 1708 is fabricated as part of the integrated circuit die 1702. The integrated circuit die 1702 may include a CPU 1704 as well as on-die memory 1706, often used as cache memory, that can be provided by technologies such as embedded DRAM (eDRAM) or spin-transfer torque memory (STTM or STTM-RAM).

Computing device 1700 may include other components that may or may not be physically and electrically coupled to the motherboard or fabricated within an SoC die. These other components include, but are not limited to, volatile memory 1710 (e.g., DRAM), non-volatile memory 1712 (e.g., ROM or flash memory), a graphics processing unit 1714 (GPU), a digital signal processor 1716, a crypto processor 1742 (a specialized processor that executes cryptographic algorithms within hardware), a chipset 1720, an antenna 1722, a display or a touchscreen display 1724, a touchscreen controller 1726, a battery 1729 or other power source, a power amplifier (not shown), a global positioning system (GPS) device 1728, a compass 1730, a motion coprocessor or sensors 1732 (that may include an accelerometer, a gyroscope, and a compass), a speaker 1734, a camera 1736, user input devices 1738 (such as a keyboard, mouse, stylus, and touchpad), and a mass storage device 1740 (such as hard disk drive, compact disk (CD), digital versatile disk (DVD), and so forth).

The communications chip 1708 enables wireless communications for the transfer of data to and from the computing device 1700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1700 may include a plurality of communication chips 1708. For instance, a first communication chip 1708 may be dedicated to shorter range wireless communications such as Wi-Fi and Bluetooth and a second communication chip 4008 may be dedicated to longer range wireless communications such as GPS, EDGE, GPRS, CDMA, WiMAX, LTE, Ev-DO, and others.

The processor 1704 of the computing device 1700 includes one or more structures fabricated using CEBL, in accordance with implementations of embodiments of the invention. The term "processor" may refer to any device or portion of a device that processes electronic data from registers and/or memory to transform that electronic data into other electronic data that may be stored in registers and/or memory.

The communication chip 1708 may also include one or more structures fabricated using CEBL, in accordance with implementations of embodiments of the invention.

In further embodiments, another component housed within the computing device 1700 may contain one or more structures fabricated using CEBL, in accordance with implementations of embodiments of the invention.

In various embodiments, the computing device 1700 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1700 may be any other electronic device that processes data.

The above description of illustrated implementations of embodiments of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

In an embodiment, a method of fine alignment of an e-beam tool includes projecting an electron image of a plurality of apertures of an e-beam column over an X-direction alignment feature of a wafer while moving the wafer along the Y-direction. The method also includes detecting a time-resolved back-scattered electron (BSE) detection response waveform during the projecting. The method also includes determining an X-position of every edge of every feature of the X-direction alignment feature by calculating a derivative of the BSE detection response waveform. The method also includes, subsequent to determining an X-position of every edge of every feature of the X-direction alignment feature, adjusting an alignment of the e-beam column to the wafer.

In one embodiment, projecting the electron image of the plurality of apertures of the e-beam column over the X-direction alignment feature of the wafer involves projecting the electron image over a periodic X-direction alignment feature.

In one embodiment, projecting the electron image of the plurality of apertures of the e-beam column over the X-direction alignment feature of the wafer involves projecting the electron image over an aperiodic X-direction alignment feature.

In one embodiment, the X-direction alignment feature further includes a Y-direction alignment aspect. The method further involves determining a Y-position of the X-direction alignment feature.

In one embodiment, determining the Y-position of the X-direction alignment feature involves detecting the position of a single longest line of the X-direction alignment feature while moving the wafer along the Y-direction.

In an embodiment, a column for an e-beam tool includes an electron source for providing a beam of electrons. A limiting aperture is coupled with the electron source along a pathway of the beam of electrons. High aspect ratio illumination optics are coupled with the limiting aperture along the pathway of the beam of electrons. A shaping aperture is coupled with the high aspect ratio illumination optics along the pathway of the beam of electrons. A blanker aperture array (BAA) is coupled with the shaping aperture along the pathway of the beam of electrons. A final aperture is coupled with the BAA along the pathway of the beam of electrons. A sample stage is included for receiving the beam of electrons. An electron detector is included for collecting backscattered electrons from an X-direction alignment feature of a wafer on the sample stage while moving the wafer along the Y-direction.

In one embodiment, the electron detector is configured to determine an X-position of every edge of every feature of the X-direction alignment feature by calculating a derivative of the BSE detection response waveform.

In one embodiment, the X-direction alignment feature further includes a Y-direction alignment aspect, and the electron detector is further configured to determine a Y-position of the X-direction alignment feature.

In one embodiment, the electron detector is configured to adjust an alignment of the e-beam column to the wafer.

In one embodiment, the X-direction alignment feature of the wafer is a periodic X-direction alignment feature.

In one embodiment, the X-direction alignment feature of the wafer is an aperiodic X-direction alignment feature.

In an embodiment, a semiconductor die includes a substrate. A non-optical alignment mark is disposed in or above the substrate. The non-optical alignment mark includes an X-direction alignment feature.

In one embodiment, the X-direction alignment feature of the non-optical alignment mark is periodic.

In one embodiment, the X-direction alignment feature of the non-optical alignment mark is aperiodic.

In one embodiment, the non-optical alignment mark further includes a Y-direction alignment feature.

In one embodiment, the Y-direction alignment feature is a single longest line of the X-direction alignment feature.

In one embodiment, the non-optical alignment mark is disposed in the substrate.

In one embodiment, the non-optical alignment mark is disposed in a layer disposed above the substrate.

In an embodiment, a non-transitory machine-accessible storage medium has instructions stored thereon which cause a data processing system to perform a method of real-time alignment of a wafer situated on a stage of an e-beam tool. The method includes projecting an electron image of a plurality of apertures of an e-beam column over an X-direction alignment feature of a wafer while moving the wafer along the Y-direction. The method also includes detecting a time-resolved back-scattered electron (BSE) detection response waveform during the projecting. The method also includes determining an X-position of every edge of every feature of the X-direction alignment feature by calculating a derivative of the BSE detection response waveform. The method also includes, subsequent to determining an X-position of every edge of every feature of the X-direction alignment feature, adjusting an alignment of the e-beam column to the wafer.

In one embodiment, projecting the electron image of the plurality of apertures of the e-beam column over the X-direction alignment feature of the wafer involves projecting the electron image over a periodic X-direction alignment feature.

In one embodiment, projecting the electron image of the plurality of apertures of the e-beam column over the X-direction alignment feature of the wafer involves projecting the electron image over an aperiodic X-direction alignment feature.

In one embodiment, the X-direction alignment feature further includes a Y-direction alignment aspect. The method further involves determining a Y-position of the X-direction alignment feature.

In one embodiment, determining the Y-position of the X-direction alignment feature involves detecting the position of a single longest line of the X-direction alignment feature while moving the wafer along the Y-direction.

What is claimed is:

1. A method of fine alignment of an e-beam tool, the method comprising:
   projecting an electron image of a plurality of apertures of an e-beam column over an X-direction alignment feature of a wafer while moving the wafer along the Y-direction;
   detecting a time-resolved back-scattered electron (BSE) detection response waveform during the projecting;
   determining an X-position of every edge of every feature of the X-direction alignment feature by calculating a derivative of the BSE detection response waveform; and
   subsequent to determining an X-position of every edge of every feature of the X-direction alignment feature, adjusting an alignment of the e-beam column to the wafer.

2. The method of claim 1, wherein projecting the electron image of the plurality of apertures of the e-beam column over the X-direction alignment feature of the wafer comprises projecting the electron image over a periodic X-direction alignment feature.

3. The method of claim 1, wherein projecting the electron image of the plurality of apertures of the e-beam column over the X-direction alignment feature of the wafer comprises projecting the electron image over an aperiodic X-direction alignment feature.

4. The method of claim 1, wherein the X-direction alignment feature further comprises a Y-direction alignment aspect, the method further comprising:
   determining a Y-position of the X-direction alignment feature.

5. The method of claim 4, wherein determining the Y-position of the X-direction alignment feature comprises detecting the position of a single longest line of the X-direction alignment feature while moving the wafer along the Y-direction.

6. A column for an e-beam tool, the column comprising:
   an electron source for providing a beam of electrons;
   a limiting aperture coupled with the electron source along a pathway of the beam of electrons;
   high aspect ratio illumination optics coupled with the limiting aperture along the pathway of the beam of electrons;
   a shaping aperture coupled with the high aspect ratio illumination optics along the pathway of the beam of electrons;
   a blanker aperture array (BAA) coupled with the shaping aperture along the pathway of the beam of electrons;
   a final aperture coupled with the BAA along the pathway of the beam of electrons;
   a sample stage for receiving the beam of electrons; and
   an electron detector for collecting backscattered electrons from an X-direction alignment feature of a wafer on the sample stage while moving the wafer along the Y-direction.

7. The column of claim 6, wherein the electron detector is configured to determine an X-position of every edge of every feature of the X-direction alignment feature by calculating a derivative of the BSE detection response waveform.

8. The column of claim 7, wherein the X-direction alignment feature further comprises a Y-direction alignment aspect, and the electron detector is further configured to determine a Y-position of the X-direction alignment feature.

9. The column of claim 7, wherein the electron detector is configured to adjust an alignment of the e-beam column to the wafer.

10. The column of claim 6, wherein the X-direction alignment feature of the wafer is a periodic X-direction alignment feature.

11. The column of claim 6, wherein the X-direction alignment feature of the wafer is an aperiodic X-direction alignment feature.

12. A non-transitory machine-accessible storage medium having instructions stored thereon which cause a data processing system to perform a method of real-time alignment of a wafer situated on a stage of an e-beam tool, the method comprising:
   projecting an electron image of a plurality of apertures of an e-beam column over an X-direction alignment feature of a wafer while moving the wafer along the Y-direction;
   detecting a time-resolved back-scattered electron (BSE) detection response waveform during the projecting;
   determining an X-position of every edge of every feature of the X-direction alignment feature by calculating a derivative of the BSE detection response waveform; and
   subsequent to determining an X-position of every edge of every feature of the X-direction alignment feature, adjusting an alignment of the e-beam column to the wafer.

13. The storage medium as in claim 12, wherein projecting the electron image of the plurality of apertures of the e-beam column over the X-direction alignment feature of the wafer comprises projecting the electron image over a periodic X-direction alignment feature.

14. The storage medium as in claim 12, wherein projecting the electron image of the plurality of apertures of the e-beam column over the X-direction alignment feature of the wafer comprises projecting the electron image over an aperiodic X-direction alignment feature.

15. The storage medium as in claim 12, wherein the X-direction alignment feature further comprises a Y-direction alignment aspect, the method further comprising:
   determining a Y-position of the X-direction alignment feature.

16. The storage medium as in claim 15, wherein determining the Y-position of the X-direction alignment feature comprises detecting the position of a single longest line of the X-direction alignment feature while moving the wafer along the Y-direction.

* * * * *